United States Patent
Botez et al.

(10) Patent No.: US 6,810,053 B1
(45) Date of Patent: Oct. 26, 2004

(54) SINGLE MODE, SINGLE LOBE SURFACE EMITTING DISTRIBUTED FEEDBACK SEMICONDUCTOR LASER

(75) Inventors: Dan Botez, Madison, WI (US); James G. Lopez, Derry, NH (US); Gunawan Witjaksono, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/635,968

(22) Filed: Aug. 10, 2000

Related U.S. Application Data

(60) Provisional application No. 60/148,857, filed on Aug. 13, 1999.

(51) Int. Cl.[7] .............................. H01S 5/00; H01S 3/08
(52) U.S. Cl. .......................................... 372/45; 372/96
(58) Field of Search ............................ 372/45, 46, 96, 372/102, 108

(56) References Cited

U.S. PATENT DOCUMENTS

| | | | |
|---|---|---|---|
| 4,023,993 A | 5/1977 | Scifres et al. | 438/32 |
| 4,796,274 A | 1/1989 | Akiba et al. | 372/96 |
| 4,847,844 A | 7/1989 | Noda et al. | 372/45 |
| 4,894,835 A | 1/1990 | Uomi et al. | 372/45 |
| 4,958,357 A | 9/1990 | Kinoshita | 372/96 |
| 4,975,923 A | 12/1990 | Buus et al. | 372/50 |
| 5,052,016 A | 9/1991 | Mahbobzadeh et al. | 372/96 |
| 5,086,430 A | 2/1992 | Kapon et al. | 372/50 |
| 5,170,405 A | 12/1992 | Connolly et al. | 372/48 |
| 5,208,824 A | 5/1993 | Tsang | 372/96 |
| 5,241,556 A | 8/1993 | Macomber et al. | 372/96 |
| 5,255,278 A | 10/1993 | Yamanaka | 372/45 |
| 5,263,041 A | 11/1993 | Pankove | 372/45 |
| 5,272,714 A | 12/1993 | Chen et al. | 372/96 |
| 5,295,150 A | 3/1994 | Vangieson et al. | 372/96 |
| 5,323,405 A | 6/1994 | Kamiyama et al. | 372/18 |
| 5,329,542 A | 7/1994 | Westbrook | 372/96 |
| 5,345,466 A | 9/1994 | Macomber | 372/96 |
| 5,347,533 A | 9/1994 | Higashi et al. | 372/96 |
| 5,432,812 A * | 7/1995 | Kurobe et al. | 372/108 |
| 5,452,318 A | 9/1995 | Makino et al. | 372/96 |
| 5,536,085 A | 7/1996 | Li et al. | 372/50 |
| 5,727,013 A | 3/1998 | Botez et al. | 372/96 |
| 6,330,265 B1 * | 12/2001 | Kinoshita | 372/50 |

OTHER PUBLICATIONS

Jun–ichi Kinoshita, "Axial Profile of Grating Coupled Radiation from Second–Order DFB Lasers with Phase Shifts," IEEE Journal of Quantum Electronics, vol. 26, No. 3, Mar., 1990, pp. 407–412.

(List continued on next page.)

*Primary Examiner*—Minsun Oh Harvey
*Assistant Examiner*—Cornelius H. Jackson
(74) *Attorney, Agent, or Firm*—Foley & Lardner

(57) ABSTRACT

A surface emitting semiconductor laser capable of operating at high power levels and with high efficiency is formed to emit in a single far-field lobe in a single mode. The laser includes a semiconductor substrate and epitaxial structure including an active region layer and cladding layers. A distributed feedback grating is formed of periodically alternating grating elements to provide optical feedback as a second order grating for the effective wavelength of light generation from the active region. Surface emission in a single lobe pattern may be obtained by forming one edge face of the structure to be reflective and the other face to be antireflective. The semiconductor laser may also be formed to have a symmetric near-field pattern and single lobe surface emission utilizing a phase shift in the $2^{nd}$-order distributed feedback grating at its center and with antireflective edge faces. Passive distributed Bragg reflection gratings may be formed adjacent the distributed feedback grating to provide guided-field uniformity while maintaining high efficiency. Such laser structures provide single lobe far-field surface emission without requiring the use of lossy elements in the distributed feedback grating, thus allowing high efficiency and high power to be achieved.

15 Claims, 16 Drawing Sheets

OTHER PUBLICATIONS

S. F. Yu, et al., "Effect of External Reflectors on Radiation Profile of Grating Coupled Surface Emitting Lasers," IEEE Proceedings J. Optoelectronics, GB, Institution of Electrical Engineers, Stevenage, vol. 140, No. 1, Feb. 1, 1993, pp. 30–38.

James Lopez, et al., "Single–mode, single–lobe operation of surface–emitting, second–order distributed feedback lasers," Applied Physics Letters, AIP, USA, vol. 75, No. 7, Aug. 16, 1999, pp. 885–887.

James Lopez, et al., "Uniform near–field, symmetric–mode surface emission from complex–coupled $2^{nd}$ –order distributed–feedback lasers," Conference Proceedings, Leos '97, $10^{th}$ Annual Meeting, IEEE Lasers and Electro–Optics Society 1997 Annual Meeting, vol. 1, pp. 9–10.

B. Xu, et al., "Grating Coupling for Intersubband Emission," Applied Physics Letters, US, American Institute of Physics, New York, vol. 70, No. 19, May 12, 1997, pp. 2511–2513.

S. H. Macomber, "Nonlinear Analysis of Surface–Emitting Distributed Feedback Lasers," IEEE Journal of Quantum Electronics, vol. 26, No. 12, Dec. 1990, pp. 2065–2074.

Nils W. Carlson, et al., "Mode Discrimination in Distributed Feedback Grating Surface Emitting Lasers Containing a Buried Second–Order Grating," IEEE Journal of Quantum Electronics, vol. 27, No. 6, Jun. 1991, pp. 1746–1752.

Steven H. Macomber, et al., "Curved–Grating, Surface–Emitting DFB Lasers and Arrays," Proc. SPIE, vol. 3001, No. 42, 1997, pp. 42–54.

James Lopez, et al., "Surface–emitting, distributed–feedback diode lasers with uniform near–field intensity profile," Applied Physics Letters, vol. 73, No. 16, Oct. 19, 1998, pp. 2266–2268.

H. Kogelnik, et al., "Coupled–Wave Theory of Distributed Feedback Lasers," J. Appl. Phys., vol. 43, No. 5, May 1972, pp. 2327–2335.

Charles H. Henry, et al., "Observation of Destructive Interference in the Radiation Loss of Second–Order Distributed Feedback Lasers," IEEE J. of Quantum Electronics, vol. QE–21, No. 2, Feb. 1985, pp. 151–153.

Roel G. Baets, et al., "On the Distinctive Features of Gain Coupled DFB Lasers and DFB Lasers with Second Order Grating," IEEE J. of Quantum Electronics, vol. 29, No. 6, Jun. 1993, pp. 1792–1798.

Klaus David, et al., "Basic Analysis of AR–Coated, Partly Gain–Coupled DFB Lasers: The Standing Wave Effect," IEEE J. of Quantum Electronics, vol. QE–28, No. 2, Feb. 1992, pp. 427–433.

Masoud Kasraian, et al., "Metal–grating–outcoupled, surface emitting distributed–feedback diode lasers," Appl. Phys. Lett., vol. 69, No. 19, Nov. 4, 1996, pp. 2795–2797.

* cited by examiner

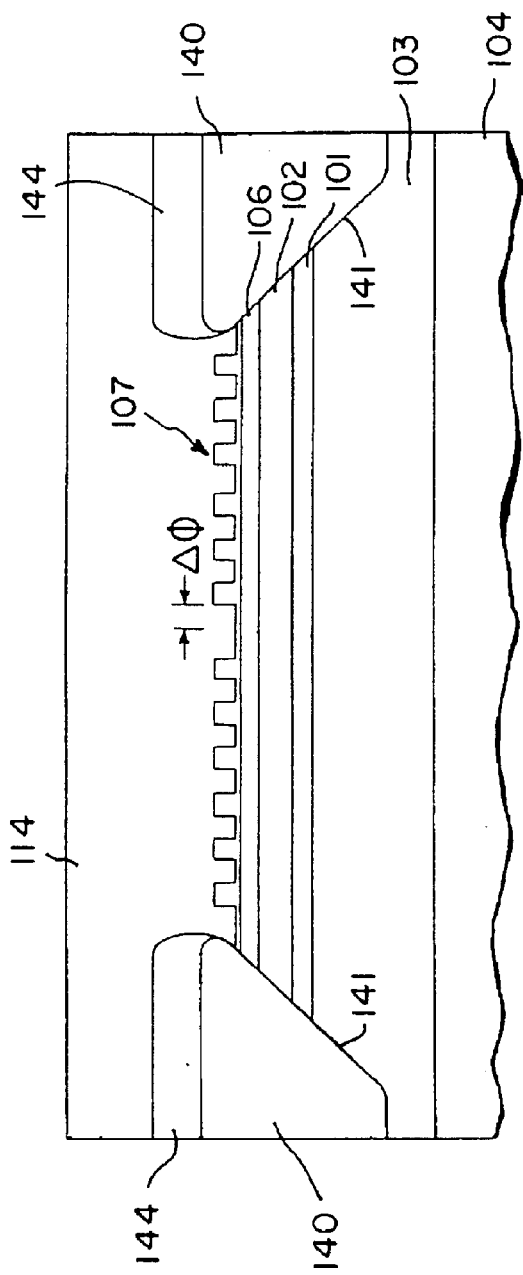
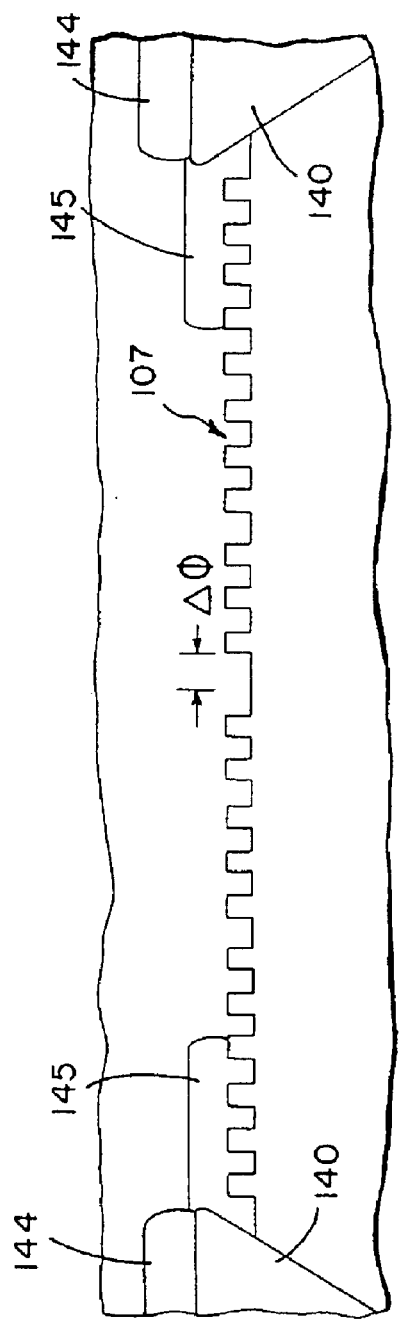

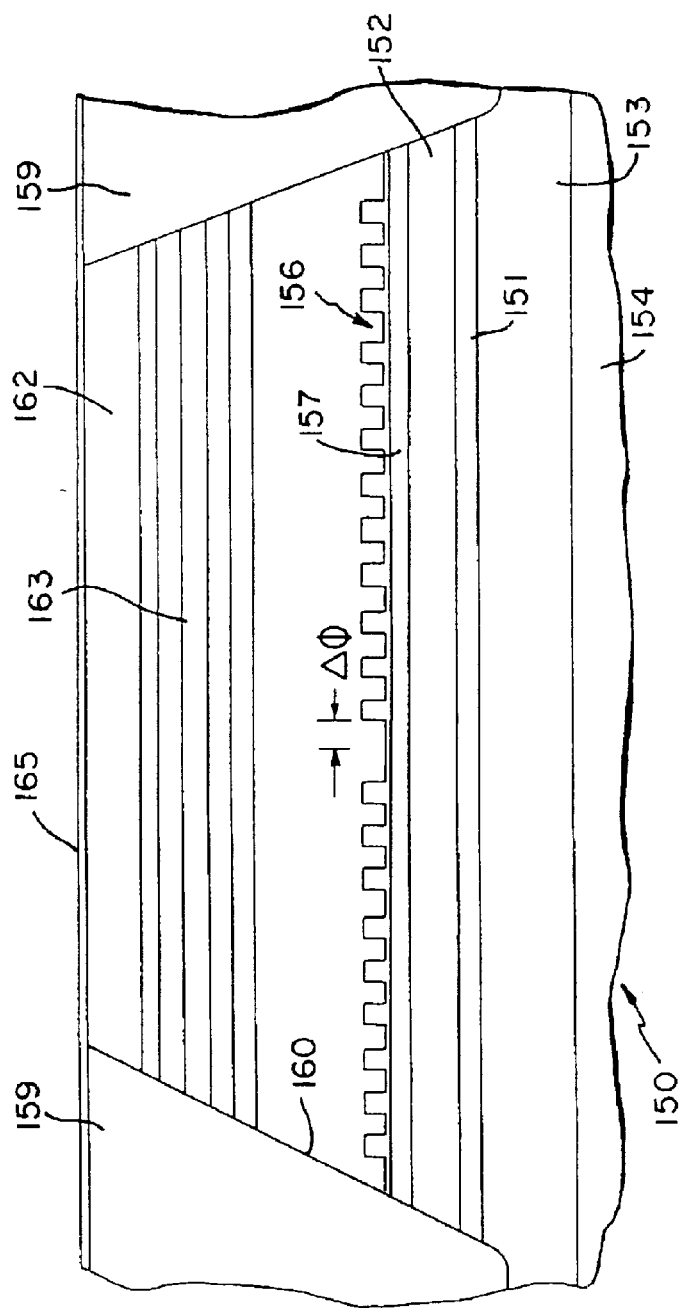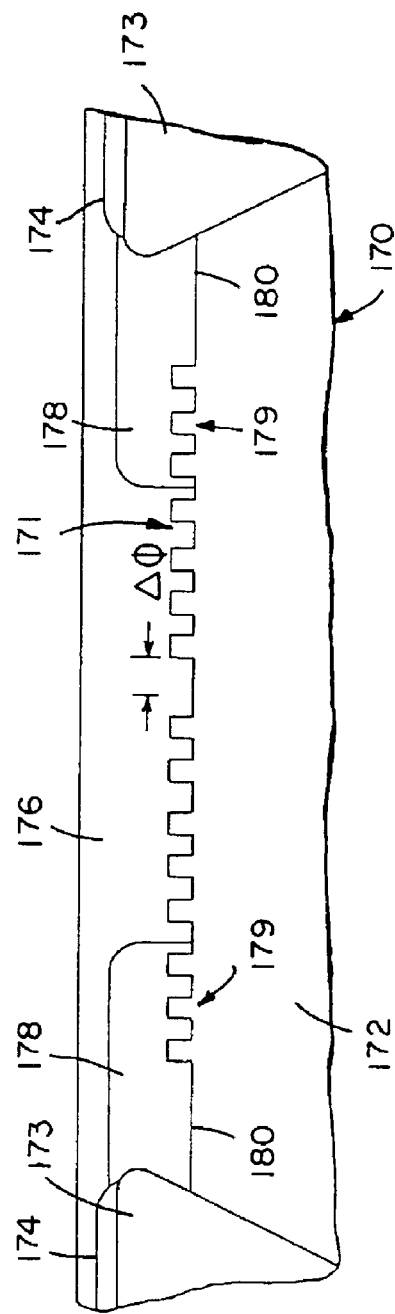
FIG. 15
FIG. 16

(a)

SINGLE MODE, SINGLE LOBE SURFACE EMITTING DISTRIBUTED FEEDBACK SEMICONDUCTOR LASER

REFERENCE TO RELATED APPLICATION

This application claims the benefit of provisional application No. 60/148,857, filed Aug. 13, 1999, the disclosure of which is incorporated herein by reference.

REFERENCE TO GOVERNMENT RIGHTS

This invention was made with United States government support awarded by the following agency: NSF 9612244. The United States government has certain rights in this invention.

FIELD OF THE INVENTION

This invention pertains generally to the field of semiconductor diode lasers and particularly to surface-emitting distributed feedback semiconductor lasers.

BACKGROUND OF THE INVENTION

Semiconductor diode lasers are formed of multiple layers of semiconductor materials. The typical semiconductor diode laser includes an n-type layer, a p-type layer and an undoped active layer between them such that when the diode is forward biased electrons and holes recombine in the active region layer with the resulting emission of light. The layers adjacent to the active layer typically have a lower index of refraction than the active layer and form cladding layers that confine the emitted light to the active layer and sometimes to adjacent layers. Semiconductor lasers may be constructed to be either edge emitting or surface emitting. In one type of edge emitting semiconductor laser, crystal facet mirrors are located at opposite edges of the multi-layer structure to provide reflection of the emitted light back and forth in a longitudinal direction, generally in the plane of the layers, to provide lasing action and emission of laser light from one of the facets. Another type of device, which may be designed to be either edge emitting or surface emitting, utilizes distributed feedback structures rather than conventional facets or mirrors, providing feedback for lasing as a result of backward Bragg scattering from periodic variations of the refractive index or the gain or both of the semiconductor laser structure. Such distributed feedback (DFB) lasers are discussed in, e.g., papers by H. Kogelnik, et al., "Coupled-Wave Theory of Distributed Feedback Lasers", J. Appl. Phys., Vol. 43, No. 5, May 1972, pp. 2327–2335; Charles H. Henry, et al., "Observation of Destructive Interference in the Radiation Loss of Second-Order Distributed Feedback Lasers," IEEE J. of Quantum Electronics, Vol. QE-21, No. 2, February 1985, pp. 151–153; Roel G. Baets, et al., "On the Distinctive Features of Gain Coupled DFB Lasers and DFB Lasers with Second Order Grating," IEEE J. of Quantum Electronics, Vol. 29, No. 6, June 1993, pp. 1792–1798; and Klaus David, et al., "Basic Analysis of AR-Coated, Partly Gain-Coupled DFB Lasers: The Standing Wave Effect," IEEE J. of Quantum Electronics, Vol. QE-28, No. 2, February 1992, pp. 427–433.

Since the early 70's, there has been interest in both theoretical and experimental studies of surface-emitting (SE) grating-coupled distributed-feedback (DFB) lasers. It has been demonstrated that $2^{nd}$ order SE-DFB lasers have attractive features such as dynamic single-mode operation, high output power, integrability with other optical components, and surface emission of light in directions substantially normal to the film waveguide. Second-order gratings provide both reflection of guided waves by means of second-order diffraction as well as radiation of free waves away from the film surfaces as a result of first-order diffraction. However, in surface emitting index coupled distributed feedback (IC-DFB) devices the radiation loss is the mode discriminator, and the mode of least radiation loss is invariably an asymmetric one, so that such devices have operated with a two-peaked anti-symmetric near-field pattern and a corresponding double-lobed far-field beam pattern. The latter feature is obviously not desirable for laser applications, since only half the emission can be used. Furthermore, due to the severe non-uniformity of the guided-field intensity profile, IC-DFB lasers are rather vulnerable to gain spatial hole burning, which in turns causes multimode operation.

Several methods for making the far-field pattern approach that of a single-lobed profile have been proposed. They include the incorporation of a phase-shifting film above the grating structure, chirping the grating structure, S. H. Macomber, "Nonlinear Analysis of Surface-Emitting Distributed Feedback Lasers," IEEE J. of Quant. Elect., Vol. 26, No. 12, December 1990, pp. 2065–2074, or preferential pumping, Nils W. Carlson, et al., "Mode Discrimination in Distributed Feedback Grating Surface Emitting Lasers Containing a Buried Second-Order Grating," IEEE J. of Quant. Elect., Vol. 27, No. 6, June 1991, pp. 1746–1752. However, these methods, respectively, result in a non-monolithic structure, off-normal radiation, and reliance on the carrier-induced index depression, a fundamentally unreliable technique. Furthermore, such structures have significantly non-uniform guided-field intensity patterns, which makes them vulnerable to gain spatial hole burning.

Surface emitting, complex coupled distributed feedback (SE-CC-DFB) lasers have been investigated which will fundamentally favor operation in a single-lobed beam that is normal to the surface by utilizing an anti-phase design with excess gain preferentially placed in the low-index regions. See M. Kasraian and D. Botez, Appl. Phys. Lett., Vol. 69, 1996, pp. 2795, et seq. and U.S. Pat. No. 5,727,013. Although ridge-guided devices of this type should be capable of providing 50–100 mW CW power, they are generally unsuitable for high power single-mode applications, since they have non-uniform guided-field intensity profiles, which makes such devices susceptible to multimode operation due to longitudinal gain spatial hole burning at high device levels above threshold. By integrating first-order distributed Bragg reflectors at the ends of the SE-CC-DFB structures, surface emitting devices can be made to lase with both relatively high external differential quantum efficiencies, $\eta_D$, as well as highly uniform near-field and guided-field intensity profiles. See, J. Lopez, M. Kasraian, D. Botez, "Surface Emitting, Distributed Feedback Diodes Lasers With Uniform Near-Field Intensity Profile," App. Phys. Lett., Vol. 73, No. 16, 19 Oct. 1998, pp. 2266–2268. The efficiency of such devices is limited, however, due to the lossiness of the grating required to suppress the anti-symmetric mode.

SUMMARY OF THE INVENTION

In accordance with the present invention, a high power surface emitting semiconductor laser operates in a single mode with a single lobe far-field radiation profile. Single lobe surface emission is achieved at high power levels with very high efficiency.

The semiconductor laser of the present invention includes a semiconductor substrate and epitaxial structure on the substrate that includes a layer with an active region at which light emission occurs, and can be constructed of a wide variety of semiconductor laser materials. Upper and lower cladding layers surround the active region layer. The semiconductor structure has upper and lower faces, and edge faces. A distributed feedback grating is incorporated with the epitaxial structure and comprises periodically alternating grating elements to provide optical feedback as a second order grating for a selected wavelength of light generation from the active region. In accordance with the present invention, index coupled distributed feedback grating devices of this type can be formed to operate in a mode in which surface emission of light is obtained in a single lobe far-field pattern, without requiring the utilization of lossy grating elements that have been required in order to suppress the antisymmetric mode. Thus, the semiconductor lasers of the present invention are capable of very high efficiency, permitting devices with high power outputs in the watt range.

In the present invention, the semiconductor laser may be formed to operate in an antisymmetric mode with an off-normal single-lobe beam pattern by forming one of the edge faces to be reflective while the other edge face is formed to be antireflective. Appropriate selection of the value of the reflectivity of the reflective edge face and the phase shift of the grating with respect to the reflective edge face results in single lobe surface light emission.

The invention may also be embodied in a structure in which the distributed feedback grating has a spacing within it defining a phase shift in the grating at a position intermediate the edge faces, preferably in the middle of the grating, with both of the edge faces formed to be antireflective (such as with the use of an antireflective coating or by providing at the ends of the grating inclined facets overgrown with absorbing material). Such a device has both a symmetric near-field intensity pattern and a single lobe far-field which is emitted normal to a face of the device. A relatively uniform guided-field intensity pattern helps prevent multi-moding due to gain spatial hole burning. The device of the invention may be further embodied by utilizing passive distributed Bragg reflectors formed adjacent the ends of the distributed feedback grating to simultaneously obtain high efficiency and a high degree of guided-field uniformity. Such devices may be terminated longitudinally with anti-reflective edge faces or with inclined end facets that are overgrown with absorbing material. Such distributed Bragg reflectors may be formed as either first order or second order passive gratings.

A preferred distributed feedback grating in accordance with the invention utilizes low loss reflective elements. An exemplary preferred grating may be formed in GaAs and covered with gold. The laser structure may utilize a wide variety of material systems, such as, but not limited to, GaAs-based systems, e.g., with an active region of InGaAs quantum wells between InGaAsP confinement layers, and with InGaP cladding layers and a GaAs/Au distributed feedback grating.

Further objects, features and advantages of the invention will be apparent from the following detailed description when taken in conjunction with the accompanying drawings.

BRIEF DESCRIPTION OF THE DRAWINGS

In the drawings:

FIG. 13 is an illustrative cross-sectional view of another embodiment of the invention having etch and re-growth regions at the terminations of the grating.

FIG. 14 is a cross-sectional view of semiconductor laser similar to that of FIG. 13 and further including distributed Bragg reflector regions at the ends of the grating.

FIG. 15 is a cross-sectional view of another semiconductor laser structure of the invention utilizing a superlattice reflector.

FIG. 16 is a simplified cross-sectional view of another embodiment of the semiconductor laser structure of the invention having distributed Bragg reflectors at the ends of the grating spaced from etch and re-growth regions.

DETAILED DESCRIPTION OF THE INVENTION

Figure 1:
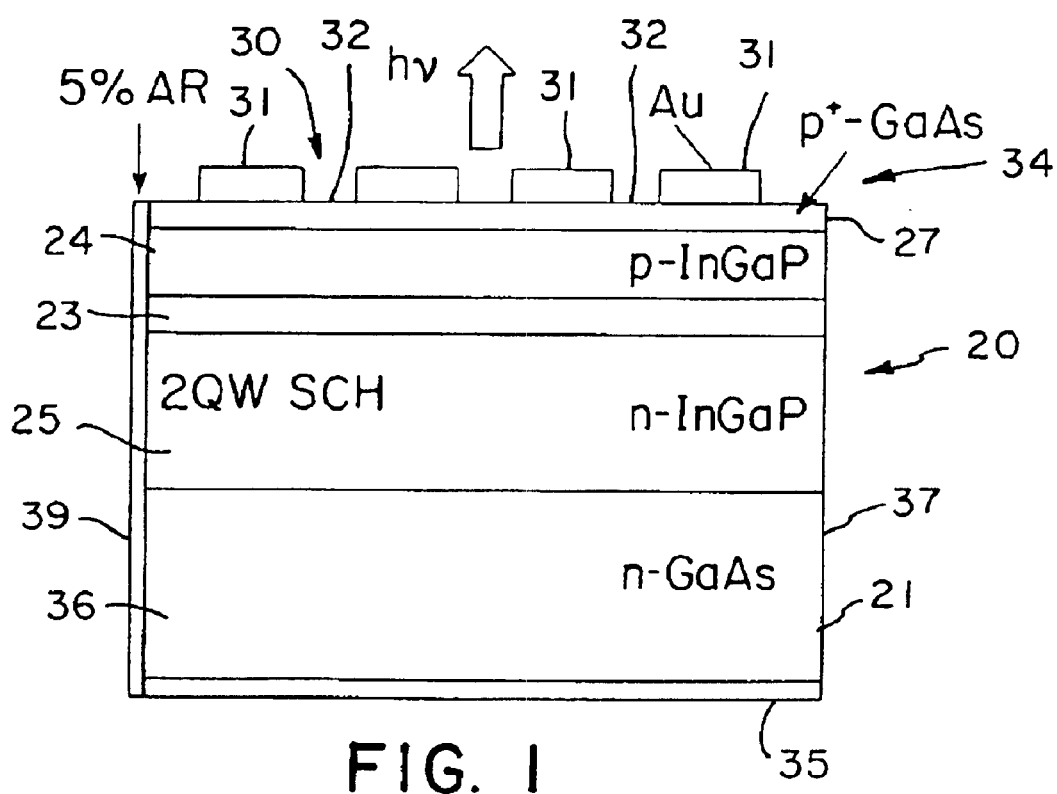
FIG. 1 is a simplified cross-sectional view of a semiconductor laser structure incorporating the invention.

With reference to the drawings, a semiconductor laser incorporating the present invention is shown generally at 20 in a simplified longitudinal cross-sectional view in FIG. 1. The device 20 is formed on a substrate 21, e.g., n-type crystalline GaAs, with an epitaxial structure grown thereon which includes an active region layer 23, an upper cladding layer 24 and a lower cladding layer 25 which together surround the active region layer 23, and a cap layer 27. The epitaxial structure formed of the layers 23, 24, 25 and 27 may be grown on the substrate 21 in a conventional fashion, e.g., by metal organic chemical vapor deposition (MOCVD). An exemplary material system for the layers of the epitaxial structure includes a separate confinement heterostructure (SCH) double quantum well InGaAs/InGaAsP active region layer 23 with p-type and n-type InGaP cladding layers 24 and 25. In the active region layer 23, an exemplary structure may include double quantum wells of 7 nm thick InGaAs and 100 nm thick InGaAsP (1.62 eV) confinement layers. The upper cladding layer 24 may, e.g., be a low-doped ($5\times10^{17}$ cm$^{-3}$) p-type InGaP cladding layer (e.g., 0.2 $\mu$m thick), and the cap layer 27 may be formed of a very thin (e.g., 500 Å) heavily doped p-type GaAs layer, allowing for effective coupling to a grating 30 formed of alternating reflective grating elements 31 separated by light transmissive interelement regions 32. As an example, the elements 31 may be formed of gold and the transmissive element 32 may be open and thus comprise air. Other transmissive materials (e.g., SiO$_2$ or appropriate dielectrics) may constitute the transmissive elements. A ridge waveguide for lateral mode control (formed as described further below and not shown in FIG. 1) may be formed by photolithographically defined stripes (e.g., 4 $\mu$m-wide) on top of the GaAs cap layer 27, followed by chemical etching of the GaAs. Current confinement may be provided by a window stripe (e.g., 3 $\mu$m-wide SiO$_2$ defined) above the ridge structure. As described further below, the grating 30 may be formed by holographic exposure and liftoff of the grating metal (e.g., 300 Å of Au) above the ridge structure. An exemplary grating 30 may have a period of 2950 Å and 70% duty cycle (that is, the percentage of the period of that is the reflective metal, in the example shown, Au). The period, $\Lambda$, of the grating is chosen to be equal to (or substantially so) the selected wavelength of emission of light in the active region ($\Lambda=\lambda_o/n_{eff}$ where $n_{eff}$ is the effective index of refraction), i.e., the grating is a second order grating. The grating 30 makes contact with the ridge waveguide through the SiO$_2$ defined window. For the structure shown in FIG. 1 and described above, the grating coupling coefficient is $\kappa=-15-4.74i$. To form the upper electrode for the semiconductor laser, a suitable contact metal (e.g., 20 Å of Ti, 20 Å of Pt, and 1000 Å of Au) may be deposited over the ridge structure and then lifted off over the ridge-waveguide region. The TiPtAu contact is thus connected to the elements 31 of the grating which covers the ridge waveguide, thereby defining with the elements 31 an electrode for current injection at the upper face 34 of the semiconductor laser structure. The lower face of the semiconductor structure 20 at the bottom of the substrate 21 may have a layer of metal 35 deposited thereon to define a lower electrode, thereby allowing current to be injected across the semiconductor structure between the electrodes at the top face and the bottom face.

Figure 2:
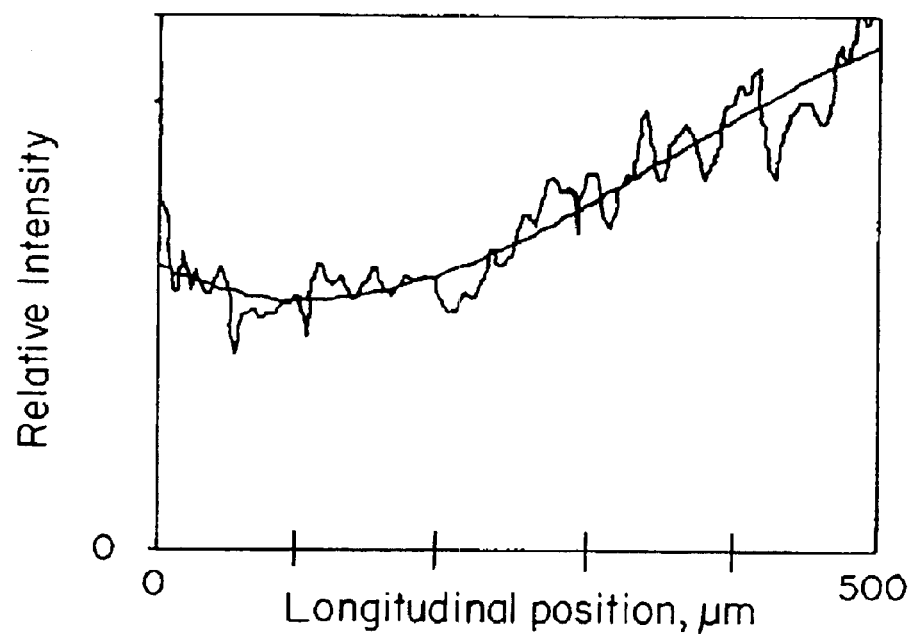
FIG. 2 is a graph illustrating the near-field relative intensity as a function of longitudinal position along the emitting surface of the semiconductor laser of FIG. 1.
Figure 3:
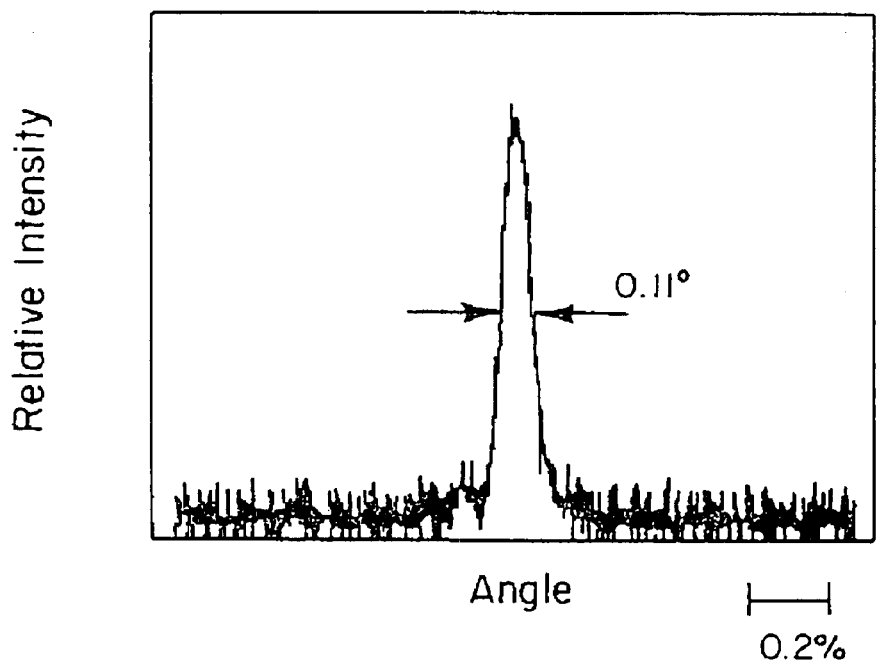
FIG. 3 is a graph illustrating the far-field relative intensity versus angle from a normal to the emitting surface of the semiconductor laser of FIG. 1.

The semiconductor structure described above may be cleaved to provide facets that define edge faces 36 and 37. In accordance with the embodiment of the invention in FIG. 1, the reflectivities at the edge faces 36 and 37 are made non-symmetric. For example, the edge face 37 may be left as a natural cleaved facet having a reflectivity of about 30%, and the edge face 36 may be provided with an antireflective coating 39 which yields an effective reflectance of about 5% at the edge face 36. A 500 $\mu$m long laser of this type is found to have the near-field intensity profile between the edge faces shown in FIG. 2, with laser light emitted from the upper face surface 34 in a diffraction-limited (0.11°) single lobe pattern as illustrated in FIG. 3 up to 1.5 times the threshold current $I_{th}$ ($I_{th}$=23–25 mA). The light is emitted through the interelement spaces 32 between the reflective grating elements 31. The recorded spectrum is a 0.25 Å-wide single longitudinal mode, which varies with heat sink temperature at a rate of 0.6 Å/° C., thus confirming distributed feedback action. Based on the differences in indices of refraction between GaAs and air, and that 70% of the light that is diffracted upwards is reflected by the reflecting elements 31 (e.g., Au) in the grating, it is estimated that about 90% of the light is directed into the substrate 21. Thus, the detected power in air is only a few mW. It is found from 2-D coupled mode analysis that the best fit for the experimental near-field pattern occurs for grating phase values (spacing between the end element 31 and the adjacent edge face relative to a full period of the grating) of 40° and 10° with respect to the high-reflective facet 37 and the low-reflective facet 36, respectively, and that single-lobe operation is obtained from such devices.

Since the device 20 is an index-coupled DFB laser ($n_{Au}$=–0.1+6.54i, $n_{air}$=1), it would be expected from experience with conventional index-coupled DFB lasers that the measured near-field pattern would exhibit an intensity null in the center which is characteristic of the anti-symmetric mode and that a double-lobed far-field would be expected. However, the data shown in FIGS. 2 and 3 indicate that a mode is occurring which is neither symmetric nor anti-symmetric. The near-field intensity profile of FIG. 2 is anti-symmetric, but the far-field intensity profile of FIG. 3 is single-lobed, which is a feature ordinarily uniquely associated with a symmetric near-field intensity profile. In addition, the far-field beam is diffraction limited. Such a result is contrary to conventional analysis of surface emitting DFB lasers which had indicated that the only way that a single-lobed far-field could be fundamentally produced from such lasers was for the anti-symmetric mode to be made to have a higher threshold than the symmetric mode through the use of a loss-coupled grating. However, the grating 30 of the present invention, utilizing fully reflective metal elements 31 (e.g., Au) separated by air, has no losses, so that clearly the grating itself cannot discriminate the anti-symmetric mode. In accordance with the invention, it is found that by leaving one facet of the index coupled DFB laser uncoated or highly reflective coated while the other facet is antireflective coated, an additional mode is added to the spectrum which occurs within the forbidden stop band and therefore may be termed a "gap" mode. This gap mode is formed by Bragg reflection by the grating 30 in one direction and reflection by the facet at the edge face 37 in the other direction. The reflected waves travelling in opposite directions combine to produce the near-field profiles shown in FIG. 2. The shape of the near-field intensity profile, the far-field intensity profile, and the gain threshold and slope efficiency of the gap mode depends strongly on the grating phase $\Delta\phi_{HR}$ at the uncoated facet 37 as well as the magnitude of the reflection. The far-field is single-lobed only over a defined range of facet phase shifts $\Delta\phi_{HR}$ from about 10° to 80°. From 80° to 180° and from 0° to 10°, the far-field is either double-lobed or has a shoulder. The pattern repeats for $\Delta\phi_{HR}$=180° to 360°.

Figure 4:
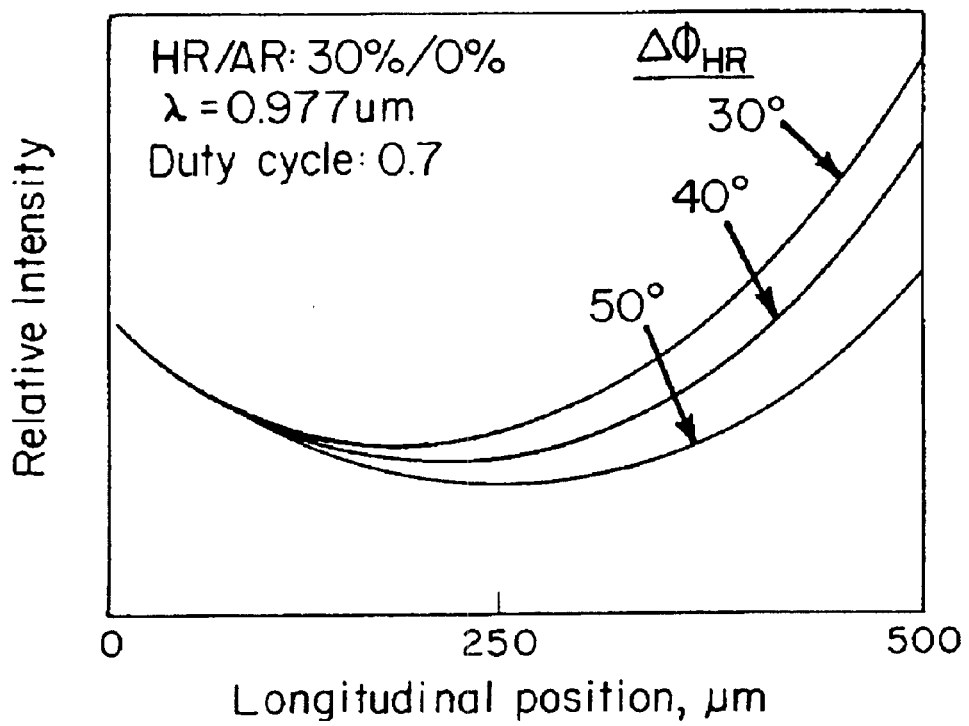
FIG. 4 is a computed graph of near-field relative intensity, similar to the graph of FIG. 2, for another embodiment of the semiconductor laser of FIG. 1.
Figure 5:
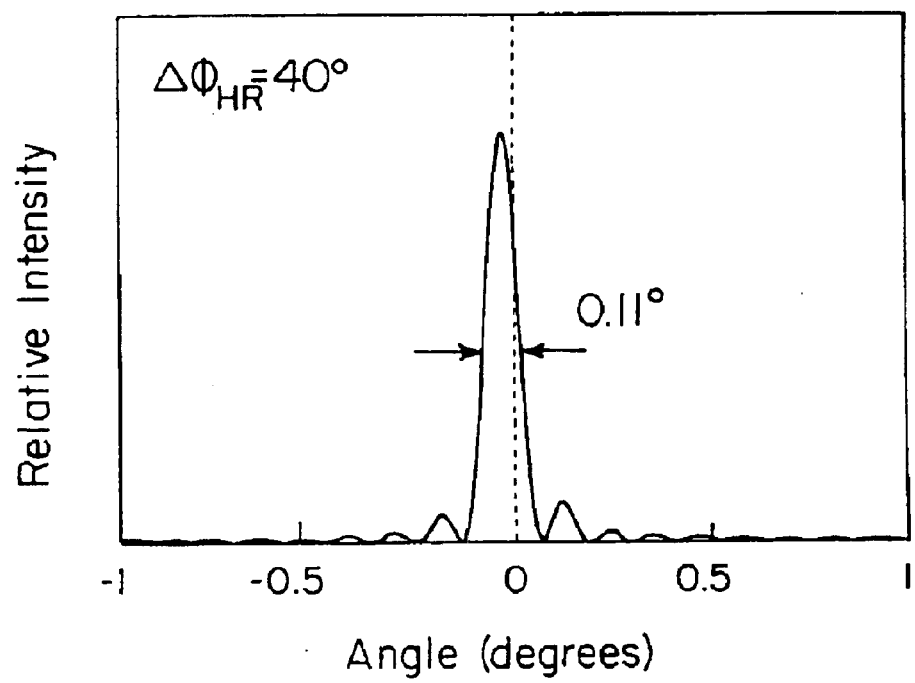
FIG. 5 is a computed graph of the far-field relative intensity, similar to that of FIG. 3, for another embodiment of the semiconductor laser of FIG. 1.

A further example of the laser structure 20 of FIG. 1 is a device with 30% high-reflectivity (HR) coating on one edge face and an antireflective (AR) coating (i.e., 0% reflectivity) on the other edge. FIG. 4 shows the near-field pattern and FIG. 5 the far-field pattern for this device. Single-lobe operation is obtained for HR-facet grating phase, $\Delta\phi_{HR}$, values in the 10°–80° range. The single lobe is off normal (see FIG. 5), as expected, due to the phase ramp across the device. Near-field intensity profiles, as shown in FIG. 4, are relatively non-uniform with the smallest peak to valley ratio, R, of 2.6 for $\Delta\phi_{HR}$=50°. Over the 40°–60° $\Delta\phi_{HR}$ range the intermodal discrimination, $\Delta g_{th}$, varies from 6.4 cm$^{-1}$ to 8.8 cm$^{-1}$, while the gain threshold is ~26 cm$^{-1}$, and $\eta_D$ varies from 14% to 10%.

A further example of the laser structure of FIG. 1 is a device coated to be 99% reflective on one edge face and 0% reflective (AR) on the other edge face. For such a device, single-lobe operation with relatively uniform near-field profiles (i.e., R≤2) occurs over the $\Delta\phi_{HR}$ range: 45–65°. The modal discrimination, $\Delta g_{th}$, increases: 13–14.7 cm$^{-1}$; the gain threshold, $g_{th}$, decreases: 15.5–14.3 cm$^{-1}$; and, most importantly, $\eta_d$ increases: 22–18%. Such devices require very low reflectivity (<10$^{-4}$) coatings on one facet, and would have a relatively low yield of single-lobe operation with nearly uniform intensity profile because the grating phase at the cleaved HR-coated facet is difficult to control and may be random.

A 99% highly reflective coating acts as an almost perfect mirror. A DFB laser of length L with a perfect reflector on one facet and a perfect absorber on the other facet may be considered equivalent to a DFB laser of length 2L with perfect absorbers on both facets. See, e.g., W. Streifer, et al., "Effects of External Reflectors on Longitudinal Modes of Distributed Feedback lasers," IEEE J. Quantum Electron., QE-11, 1974, pp. 154–161. In effect, the perfect reflector on the one facet produces a mirror image of the grating, which acts as a virtual DFB section which has a coupling coefficient and length equal to that of the actual DFB.

Figure 6:
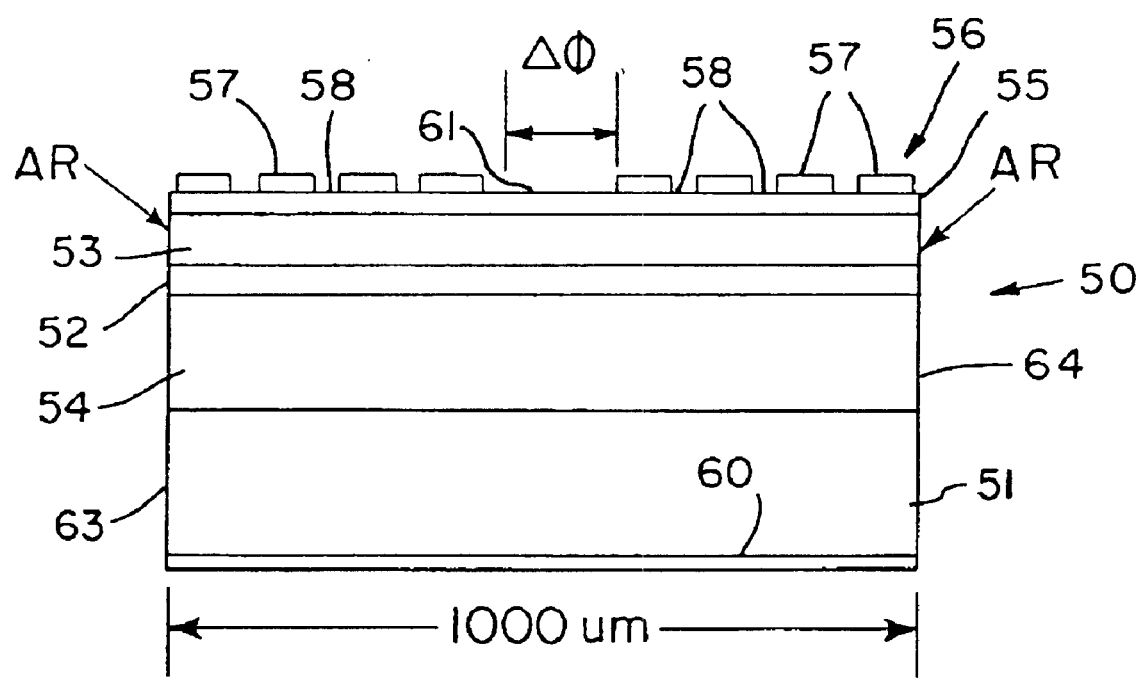
FIG. 6 is a simplified cross-sectional view of another embodiment of a semiconductor laser in accordance with the invention.

Accordingly, a semiconductor laser 50 embodying the present invention which does not require the utilization of highly reflective facets is shown at 50 in FIG. 6. The semiconductor laser 50 may have the same structure as the semiconductor laser 20 of FIG. 1, including a substrate 51, an active region layer 52, an upper cladding layer 53 and a lower cladding layer 54 surrounding the active region layer 52, a cap layer 55, a grating 56 comprising reflective grating elements 57 separated by light transmissive elements 58 (e.g., air) and a layer 60 on the lower face of the structure to provide one of the electrodes by which current may be injected across the semiconductor laser 50. The materials of the laser 50 may be, for exemplification, the same materials as illustrated for the device 20 of FIG. 1, although it is understood that the present invention is not dependent upon any particular material system and may be used with various types of semiconductor laser material systems. The device 50 has a phase shift $\Delta\phi$ in the middle of the grating 56, defined as a space 61 which separates adjacent elements 57 of the grating at a position intermediate the edge faces 63 and 64 (preferably in the middle) of the structure. The edge faces 63 and 64 are preferably antireflection coated facets. Equivalently, the surfaces at the edge faces 63 and 64 may be made inclined and highly absorbing (e.g., by etching and regrowth) to function as antireflection coated facets. The near-field pattern for the device 50 of FIG. 6 is shown in FIG. 7A, the guided-field pattern is shown in FIG. 7B, and the far-field pattern is shown in FIG. 8.

Figure 7A:
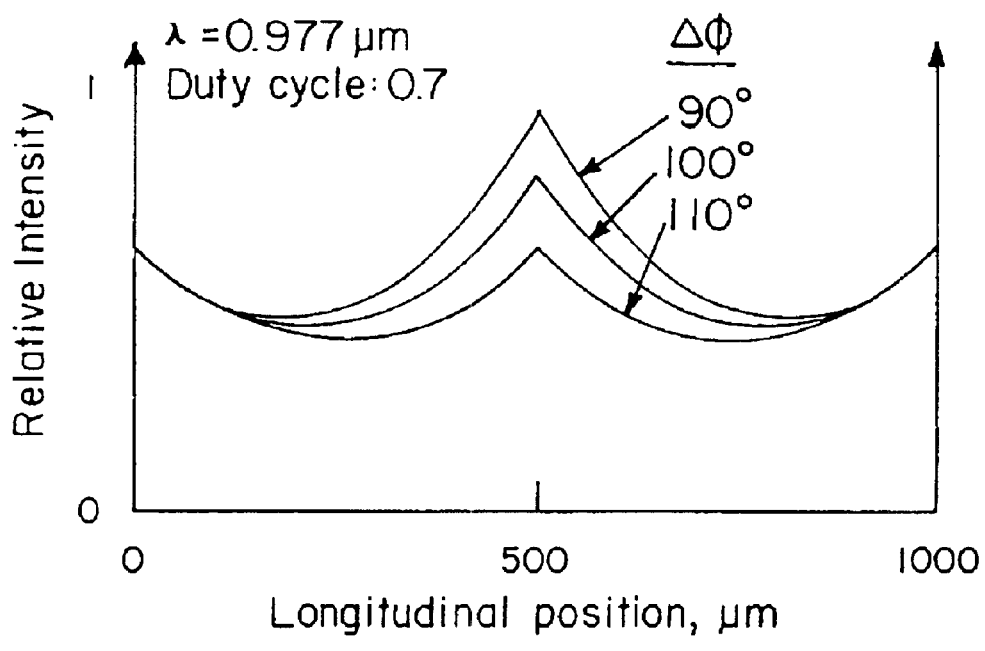
FIG. 7A is a computed graph of the near-field relative intensity for the semiconductor laser of FIG. 6.
Figure 7B:
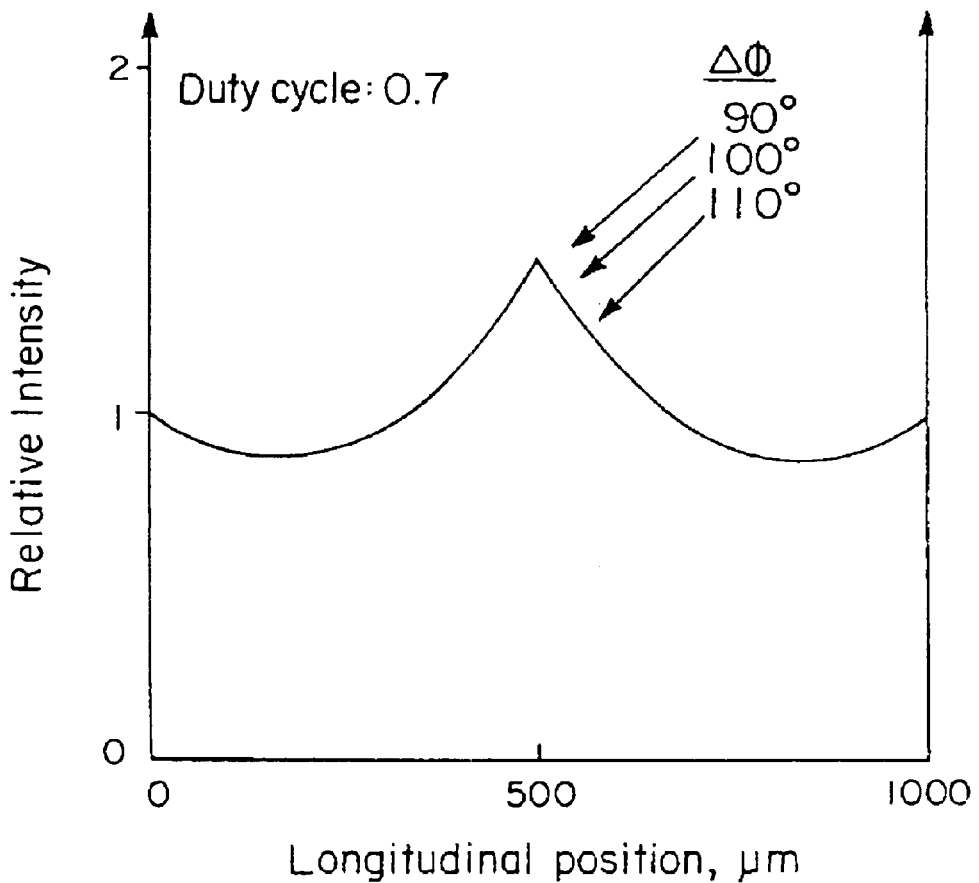
FIG. 7B is a computed graph of the guided-field relative intensity for the semiconductor laser of FIG. 6.

It is seen from FIG. 7A that for $\Delta\phi$=90°–110° the near-field intensity profile is substantially uniform (i.e., R<2), reaching R values as low as 1.5 at $\Delta\phi$=110°, and as shown in FIG. 7B the guided-field intensity profile has a low peak-to-valley ratio, R', of 1.55, thus preventing multimoding due to gain spatial hole burning (GSHB). As shown in FIG. 7B, the guided-field relative intensity does not change significantly over the phase shift $\Delta\phi$ range of 90° to 110°.

Figure 8:
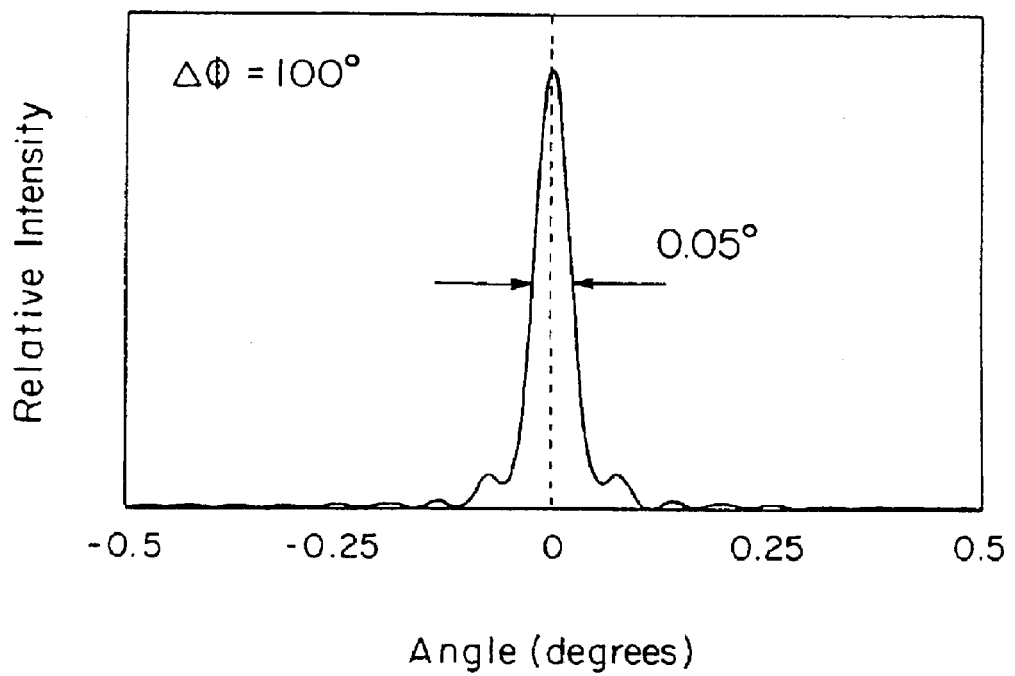
FIG. 8 is a computed graph of the far-field relative intensity for the semiconductor laser of FIG. 6.

Furthermore, as opposed to a chirped grating or the asymmetric-coated devices 20, the far-field pattern of the device 50 has an orthonormal single lobe as shown in FIG. 8. That is, symmetric-mode operation can be obtained without need of an absorptive grating. The phase front is slightly curved (~1 rad at the center with respect to the edges), but that has a negligible effect on the far-field pattern. As $\Delta\phi$ varies from 90° to 130°, $\Delta g_{th}$ varies from 4.3 to 7 cm$^{-1}$, $g_{th}$ varies from 15.4 to 14 cm$^{-1}$, and $\eta_d$ varies from 22 to 18%. The phase shift at the center of the grating can be fabricated by e-beam or optical lithography, just as for the fabrication of quarter-wave phase-shifted DFB edge emitters.

Because the semiconductor laser 50 operates with a symmetric (surface-emitting) mode, $\eta_D$ can be increased by increasing the κL product, where L is the grating-section length. Simply increasing the length from 1 mm to 1.5 mm brings about a 65% increase in $\eta_D$ (e.g., from 19.5% to 32% when $\Delta\phi$=100°), but the near-field uniformity degrades (e.g., R increases from 1.5 to 2.6 when $\Delta\phi$=110°). $\eta_D$ values as high as 35% are obtained ($\Delta\phi$=100°), but again at a price in near-field uniformity. Increasing κ brings about similar results. The tradeoff between $\eta_D$ value and the degree of near-field uniformity is quite similar to that encountered for absorptive-grating, single-lobe surface emitters.

Figure 9:
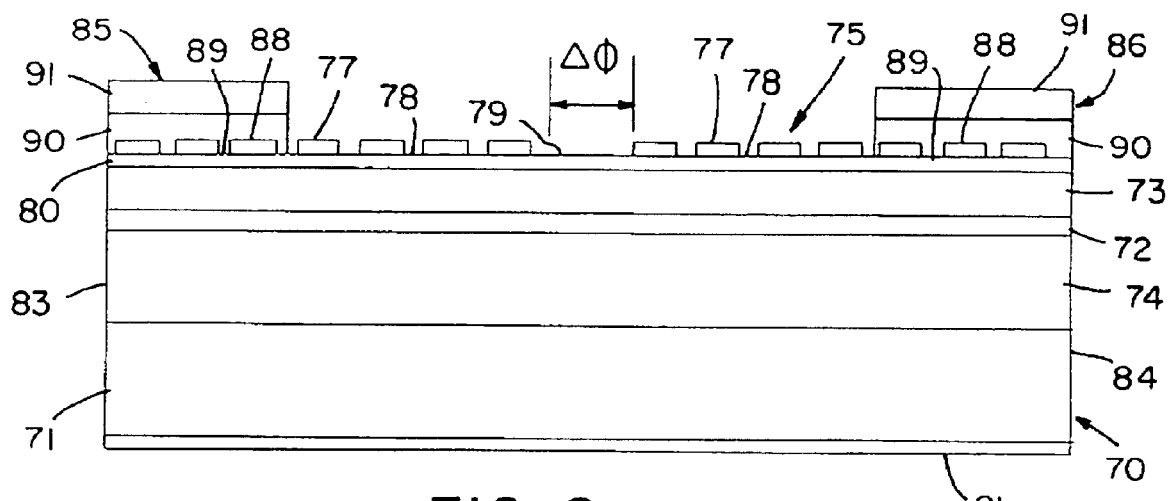
FIG. 9 is a simplified cross-sectional view of a further embodiment of a semiconductor laser in accordance with the invention.

In accordance with the invention, a semiconductor laser incorporating the invention which simultaneously achieves high $\eta_D$ values and a high degree of near-field and guided-field uniformity may be formed as illustrated by the semiconductor laser device shown generally at 70 in FIG. 9. The device 70 has a substrate 71 on which is formed an epitaxial structure including an active region layer 72, an upper cladding layer 73 and a lower cladding layer 74 which surround the active region layer, a second order distributed feedback grating 76 comprised of reflective grating elements 77 with transmissive elements 78, and a space 79 between the grating elements, preferably at the middle of the grating, to define a grating phase shift $\Delta\phi$. The structure also includes a cap layer 80 on which the grating 76 is formed and a bottom metal layer 81 on the lower face of the structure to provide a lower electrode. All of the foregoing structures may be formed as described above for the devices 20 of FIG. 1 and 50 of FIG. 6. The semiconductor laser 70 further has edge faces 83 and 84 which may be formed in any desired fashion. The edge faces 83 and 84 are preferably formed as antireflection edges, either by antireflection coating or by forming absorptive material at inclined edges. Passive distributed Bragg grating end reflectors 85 and 86 are formed at positions adjacent the edge faces 83 and 84 and are formed of grating elements 88 separated by interelement spaces 89. The period of the gratings 85 and 86, defined by the total width of the grating element 88 and the adjacent interelement space 89, may be selected to define either a first order ($\Lambda=\lambda_o/n_{eff}$) or a second order passive grating. The elements 88 may be formed of reflective material such as metal, as described above, or a variety of materials (e.g., superlattice reflectors) which will provide passive grating end reflectors in a conventional manner. The grating elements 88 are embedded in a material 90, e.g., a material (such as $SiO_2$) that is compatible with the material of the cap layer 80 and which may be grown over the grating elements 88. An isolation layer 91, e.g., of $SiO_2$, may be formed over the material 90 (or may be unitary with the material 90) and the grating elements 88 to provide electrical isolation over these elements so that no current injection occurs in the regions of the laser under the passive reflectors 85 and 86. (If desired, separate contact pads may be formed on the grating elements 88 to make an electrical connection to allow carrier induced changes in the dielectic constant in the regions 85 and 86.) Surface emission occurs only in the regions of the distributed feedback grating 76, while the distributed Bragg reflectors 85 and 86 serve as terminations. Such devices may be formed in a conventional fashion as described, e.g., in the aforesaid paper by J. Lopez, N. Kasraian, and D. Botez, Appl. Physics Lett., Vol. 73, No. 16, Oct. 19, 1998, pp. 2266–2268. The device 70 of FIG. 9 can be utilized to achieve both moderately high efficiencies (greater than 25%) together with virtually uniform guided-field patterns. A mid-grating phase shift $\Delta\phi$ for the device 70 of about 180° is generally desirable. However, depending on the parameters of the gratings, the phase shift $\Delta\phi$ can take any value between 0° and 360°.

The devices 20, 50 and 70 may be and preferably are formed with a window at the bottom face to allow light emission through the bottom face of the device.

Figure 10:
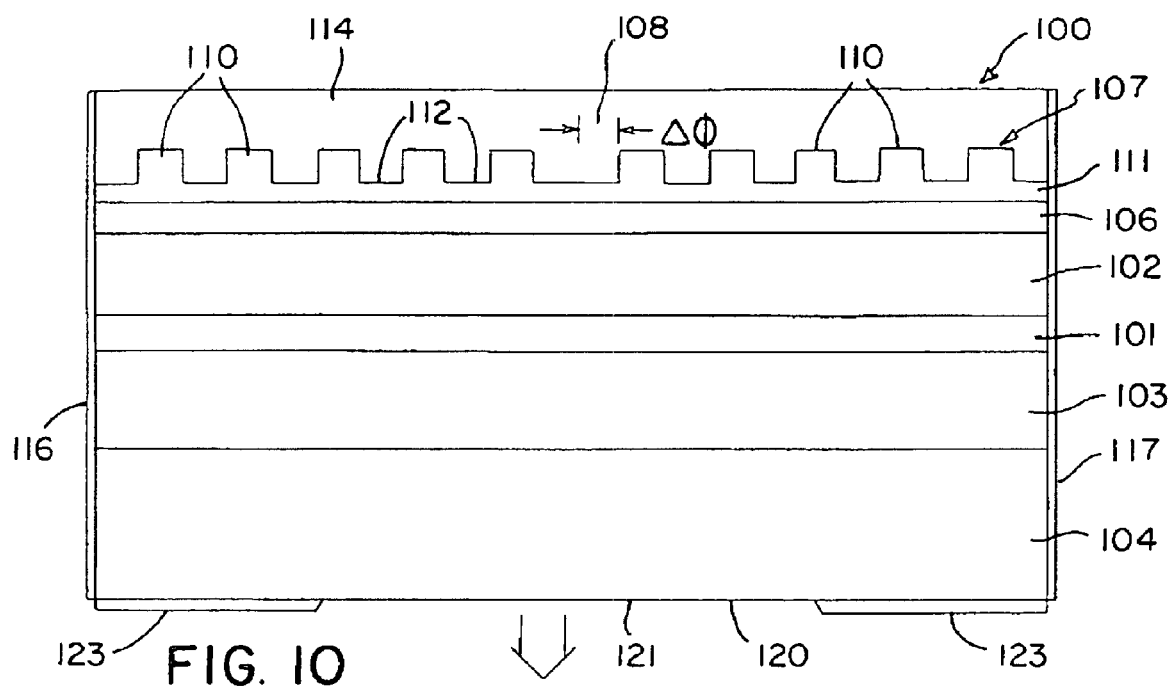
FIG. 10 is a simplified cross-sectional view of another embodiment of a bottom-emitting semiconductor laser in accordance with the invention.

A further embodiment of the invention in which light is emitted from the bottom of the substrate is illustrated at 100 in FIG. 10. The device 100 has an active region 101 surrounded by an upper cladding layer 102 and a lower cladding 103, a substrate 104, a cap layer 106, and a distributed feedback grating 107 with a spacing 108 at its middle defining a phase shift $\Delta\phi$ in the middle of the grating. The grating 107 is formed of, e.g., GaAs grating elements 110 that are defined in a layer of GaAs 111 that is formed on the cap layer 106. The grating elements 110 may also be formed directly on the cap layer 106. The other grating elements 112 are formed of, e.g., gold deposited over the elements 110 and completely covering those elements as well as the inner elements basis 112 with a layer 114 of gold. The edge faces 116 and 117 have anti-reflective coatings formed thereon. The bottom face 120 of the semiconductor structure has a window 121 formed therein defined in a metal layer 123 that provides the bottom electrode connection to the semiconductor structure, with the metal layer 114 providing the upper electrode. The window area 121 is preferably provided with an anti-reflective coating. The anti-reflective coatings at the edge faces 116 and 117 preferably provides very low reflectivity, e.g., less than 0.1%. The height of the grating elements 107 may be, e.g., 500 to 1,000 Å. The alternative grating elements 110 and 112 preferably have equal width, i.e., a 50% duty cycle for the grating. It is understood that in actual physical embodiments of the grating 107 the deposited GaAs is substantially sinusoidal in shape rather than the square wave pattern shown for illustration in FIG. 10. The active region, cladding layers, substrate, etc. of the semiconductor laser structure 100 may be the same as described above for the laser structures 20, 50 and 70.

The grating elements 112 and the layer 114 are preferably perfectly reflective, so that all the light striking these structures is reflected downwardly into the substrate. Emission of light occurs from the bottom of the structure through the window 121 in a highly efficient manner. The GaAs/Au exemplary grating 107 of FIG. 10 has the advantage of a much stronger coupling coefficient ($\kappa=-21.9-33i$) than an Au/air grating ($\kappa=-15-4.74i$). The much higher value of the imaginary part of the coupling coefficient provides high differential quantum efficiency values, e.g., greater than 50%.

Figure 11:
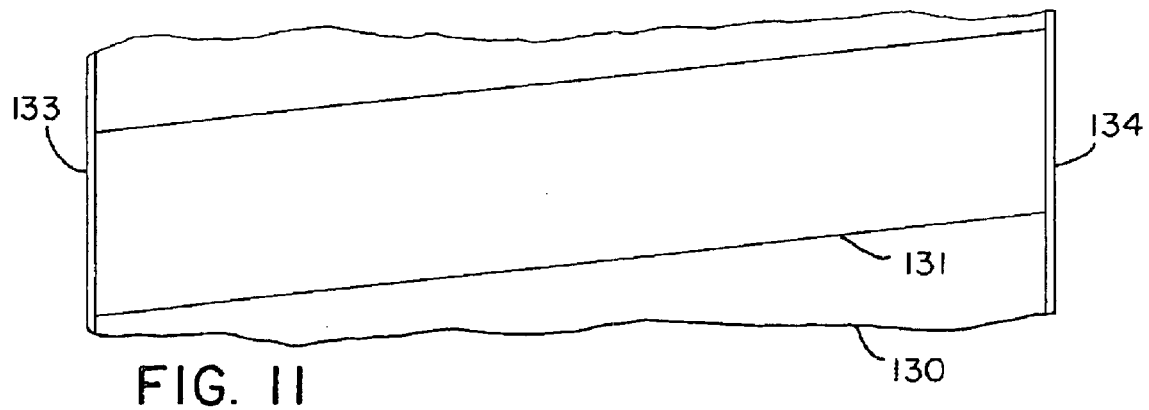
FIG. 11 is a top view illustrating angling of the lateral wave guide structure to reduce reflections at the edge facets.

Various modifications of the structures described above may be utilized to reduce the need for very low reflectivity cleaved facets in a conventional fashion. One example is illustrated in FIG. 11 which is a top view of a semiconductor laser structure 130 in which a waveguide 131 is formed at an angle to the cleaved facet edge faces 133 and 134, both of which are coated with anti-reflective coating. For an angle of the waveguide structure of, e.g., 5 to 7°, with respect to a normal to the edge facets 133 and 134, the lateral mode is deflected away from the waveguide such that the 1% reflectivity anti-reflective coating at the edge faces 133 and 134 is equivalent to a super-anti-reflective coating (in the range of 0.01% reflectivity).

Figure 12:
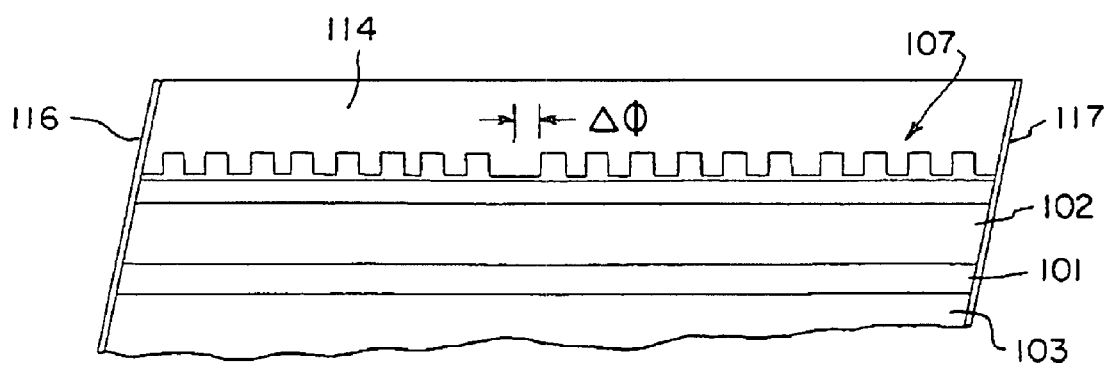
FIG. 12 is a cross-sectional view of a semiconductor laser illustrating angling of the edge facets with respect to the semiconductor structure to minimize edge reflections.

Another example of a structure in which the need for highly anti-reflective coatings may be minimized is illustrated in FIG. 12, utilizing for illustration the embodiment of the semiconductor structure 100 shown in FIG. 10. In this case, the semiconductor epitaxial structure is grown on a misoriented substrate (10–15°) such that the cleaved facets defining the edge faces 116 and 117 are 10 to 15° off a normal to the upper and lower faces of the device. In this case, the transverse mode is thrown out of the transverse waveguide and 1% anti-reflective coatings are sufficient to provide the equivalent of 0.01% anti-reflective coatings at the cleaved facets 116 and 117.

Another alternative for terminating the grating longitudinally in the semiconductor structures described above is illustrated in FIG. 13 (using the exemplary semiconductor conductor 100 of FIG. 10). In this case, the semiconductor epitaxial structure is etched at the longitudinal ends of the grating and a regrowth of a strong absorbing material in the etch region, e.g., InGaAs for a GaAs grating, is formed in areas 140 having inclined walls 141 (e.g., preferably at around 45° with respect to the plane of the grating 107). The areas 140 of absorbing material may be capped with an insulator 144 (e.g., $SiO_2$) before deposit of the layer 114 (e.g., Au). Light striking the walls 141 will be substantially either reflected at the walls 140 out of the waveguide or transmitted through the walls and absorbed in the material 140, essentially providing a highly anti-reflective termination for the grating.

Another variation of this structure is shown in FIG. 14 in which insulating materials 145 (e.g., 1,000 Å $SiO_2$) are grown over the grating 107 at the longitudinal ends of the grating before the metal layer 114 is deposited, thus blocking current flow through the end sections of the grating under the insulating layers 145. The grating under the insulating layers 145 thus defines passive distributed Bragg reflectors at the ends of the grating, providing a distributed Bragg reflector termination similar to that for the device 70 of FIG. 9. The use of distributed Bragg gratings allows both high differential quantum efficiency (larger than 50%) as well as virtually uniform guided-field patterns.

Figure 22:
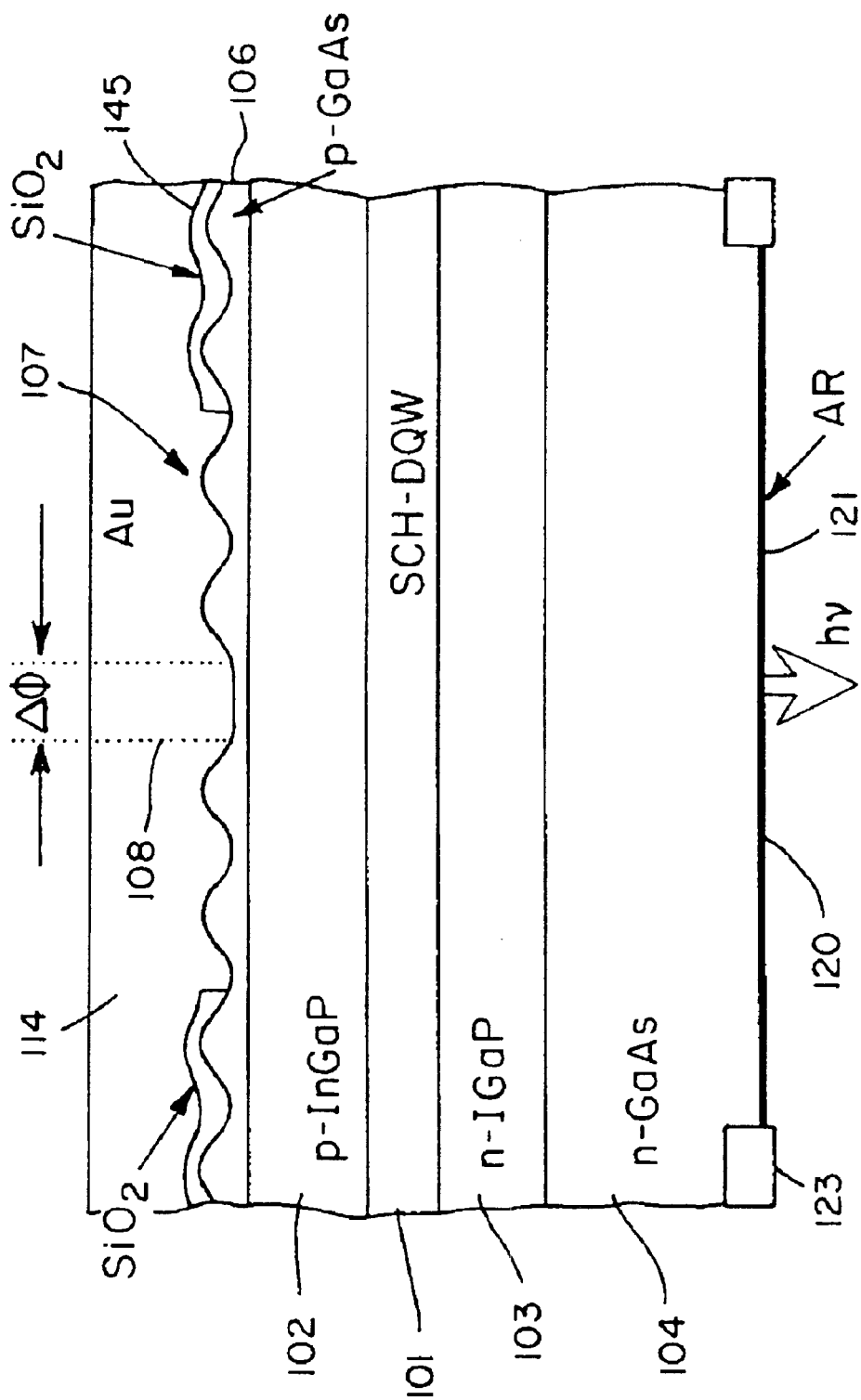
FIG. 22 is a schematic cross-sectional view of a semiconductor laser having a sinusoidal-shaped grating.
Figure 23:
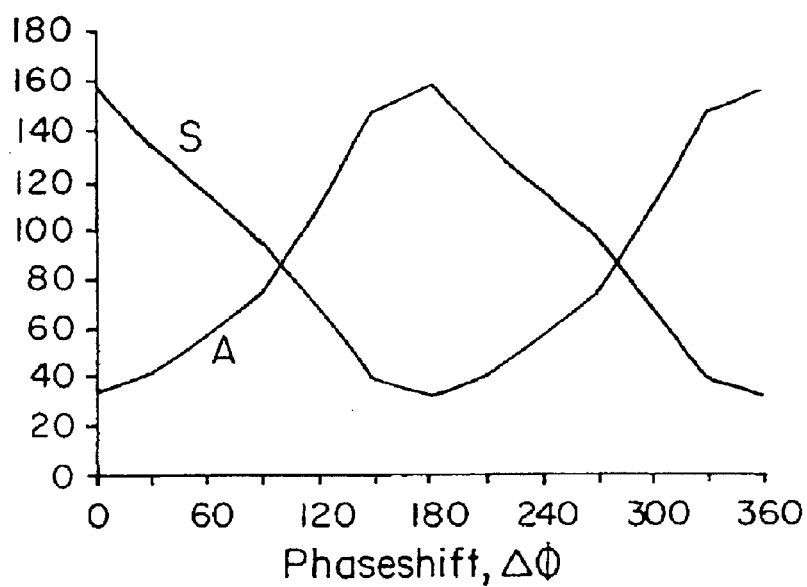
FIG. 23 is a computed graph of the mode discrimination for the device of FIG. 22 as a function of the central phaseshift value, $\Delta\phi$.

Modeling was carried out for a structure shown in FIG. 22 having a double-quantum-well InGaAs/InGaAsP active region 101 with InGaP cladding layers 102 and 103, and a grating 107 formed of GaAs/Au by etching in the p⁺-GaAs cap layer 106 followed by gold deposit, which provides both high coupling coefficient (κ) as well as ensuring that all first-order diffracted light is collected. The grating 107 was assumed to have a sinusoidal shape as illustrated in FIG. 22. The modeled device included silicon dioxide insulating layers 145, as in the device of FIG. 14. The edge terminations were assumed to be totally antireflective (zero reflectivity). As shown in FIG. 23, the modeling found that as the central phaseshift, $\Delta\phi$, varies between 100° and 280°, the symmetric mode (S) is favored over the antisymmetric mode (A), with maximum discrimination occurring at $\Delta\phi$=180°. For analysis, the model used both the coupled-mode theory as well as the transfer-matrix method. The carrier-induced depression is taken into account, and the coupling coefficients are $\kappa_{DFB}$=−5.46+i49.42 and $\kappa_{DBR}$= 2.75+i30.46 for devices with 0.3 $\mu$m-thick p-InGaP cladding and a 0.1 $\mu$m-thick InGaAsP upper confinement layer. The background absorption coefficient in the DBR regions is taken to be 15 cm⁻¹, in agreement with prior experimental results from InGaAs/GaAs DBR devices. An inspection of the differential equations for the right-going, R, and left-going, S, fields as well as of the expression for the (surface-emitted) near-field reveals that a phaseshift value of 180° is equivalent to placing a π phase-shift film on half of the emitting area; that is, a 180° central phaseshift affects only the grating-outcoupled radiation.

Figure 24:
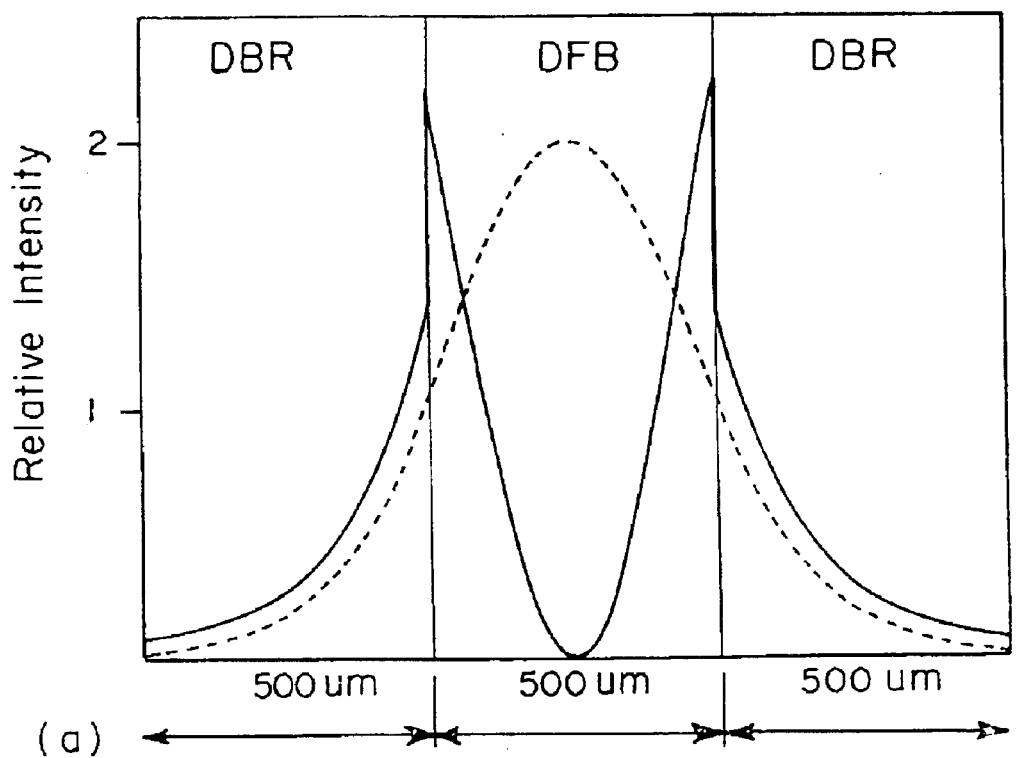
FIG. 24 is a computed graph for the device of FIG. 22 with $\Delta\phi=180°$ showing the near-field profile in the solid curve and the guided-field profile in the dashed curve.
Figure 25:
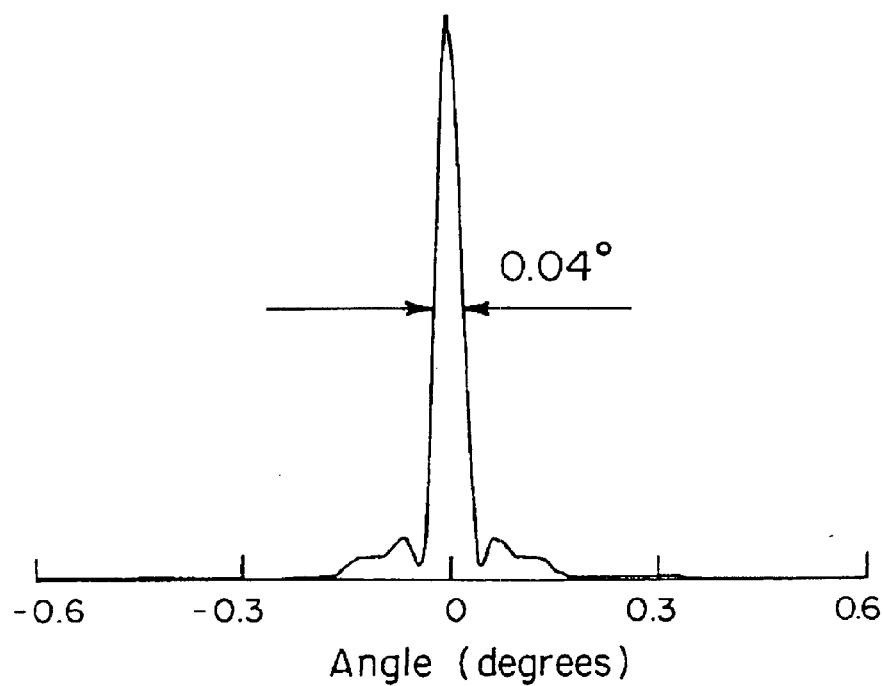
FIG. 25 is a computed graph illustrating the far-field pattern for the device of FIGS. 22 and 24.

For devices with 500 $\mu$m-long DFB and DBR regions, FIG. 24 shows the results of the modeling with $\Delta\phi$=180°, showing the near-field (solid curve) and guided-field (dashed curve) profiles. FIG. 25 shows the far-field profile for $\Delta\phi$=180°. The guided-field peak-to-valley ratio, R', in the active (i.e., DFB) region is only 2, which should insure single-mode operation to high power since the mode discrimination is high ($\geq$100 cm⁻¹, as shown in FIG. 23). The far-field consists of an orthonormal beam with 88% of the light in the central lobe.

Figure 26:
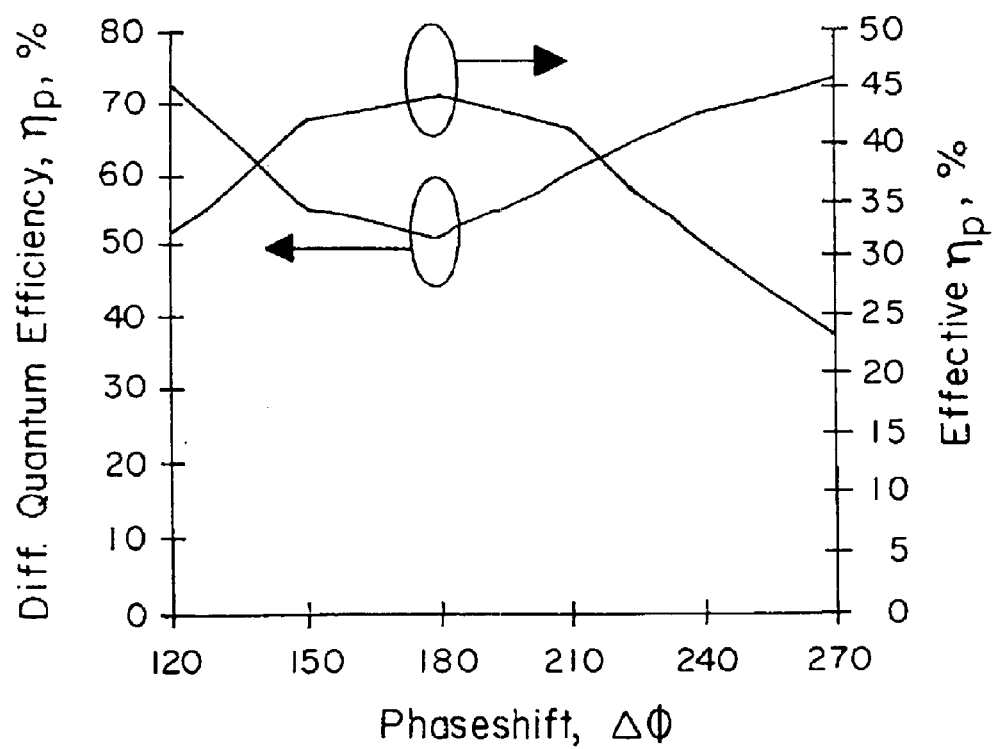
FIG. 26 are computed graphs for the device of FIGS. 22 and 24 showing the differential quantum efficiency, $\eta_D$, and the effective $\eta_D$.
Figure 27:
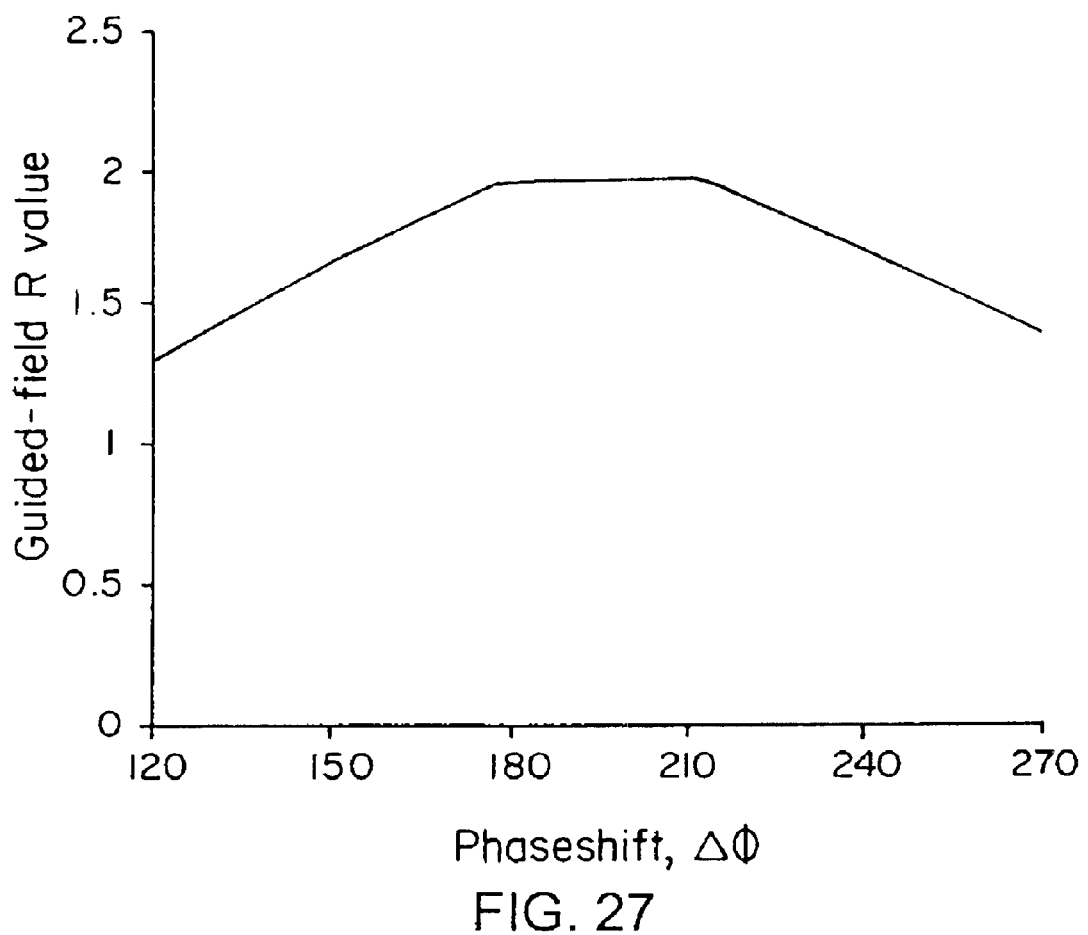
FIG. 27 is a computed graph for the device of FIGS. 22 and 24 illustrating the guided-field peak-to-valley ratio R' in the active (i.e., DFB) region as a function of the phaseshift $\Delta\phi$.

At $\Delta\phi$=180°, the differential quantum efficiency, $\eta_D$, is 51%, which reduces to 45% (i.e., effective $\eta_D$) when taking into account the central-lobe energy content. Both $\eta_D$ and the effective $\eta_D$ are plotted as a function of phaseshift $\Delta\phi$ in FIG. 26. As for the guided-field, the peak-to-valley ratio, R', while reaching a maximum of 2 at $\Delta\phi$=180°, is seen to decrease to values as small as 1.3 at $\Delta\phi$=120° and 270°, as shown in FIG. 27. As seen from FIGS. 26 and 27, over a wide range in $\Delta\phi$—in the range of 60°—the effective no is relatively high ($\geq$42%) and the degree of guided-field uniformity is low (R'<2). These devices are thus capable of providing high single-mode surface emitted power, e.g., >100 mW CW from single-element (e.g., ridge-guide) devices, and >1 W CW from 2-D surface-emitting devices with parallel-coupled phased arrays in the lateral dimension.

Another embodiment of the invention providing emission of light through the bottom of the structure is illustrated at 150 in FIG. 15. The structure 150 includes an active region 151, an upper cladding layer 152 and a lower cladding layer 153, a substrate 154, a grating 156 which may be formed on a cap layer 157, etch and regrowth regions 159 at the longitudinal ends of the grating having angled sides 160 (for the reasons described above with respect to the structure of FIG. 13), and a top semiconductor structure 162 having a superlattice reflector 163. A metal layer 165 is deposited over the top structure to provide the upper electrode. The structure 150 may be formed as described in U.S. Pat. No. 5,727,013, the disclosure of which is incorporated herein by reference, with a grating similar to that set forth therein without the utilization of absorbing material in the grating elements. The grating 156 is also formed with a spacing preferably in the middle of the grating defining a phase shift $\Delta\phi$ in the grating in accordance with the present invention. Preferably, the structure 150 further includes distributed Bragg reflectors as described above as well as the etch and regrowth regions 159.

A further alternative structure is shown generally at 170 in FIG. 16, in which the grating 171 is formed on a layer 172 (e.g., a P-InGaP cap layer), with etch and regrowth regions 173, insulating layers 174 over the etch and regrowth regions 173, and a metal (e.g., Au) layer 176 defining the upper electrode and elements within the grating 171. In the structure 170, an insulating layer is formed over the grating 171 before the metal layer 176 is deposited. However, the insulating material 178 covers not only a section 179 of the grating near its ends to define passive distributed Bragg reflectors but also sections 180 in which no grating is formed that space the grating 171 from the etch and regrowth regions 173 (e.g., by a spacing of 300 to 1,000 $\mu$m, to minimize spurious reflections into the laser structure.

In the laser devices of the invention as described above, light may be controlled laterally by a single-mode waveguide or by an anti-guided array structure in a conventional manner. Such devices are well suited for use in two-dimensional high-power surface emitters. The devices may be incorporated, for example, in a ROW array. A ROW array is a structure for which all elements of a lateral array of anti-guides couple equally with one another, and as a result of this parallel coupling a ROW array has a uniform near-field intensity profile in the lateral direction. The utilization of the devices of the invention in ROW arrays provide devices with essentially uniform near-field in both the lateral direction as well as the longitudinal direction, that is, in two dimensions. The far-field of such devices will be single-lobed and normal to the surface. Such devices may be utilized to provide table, diffraction limited power at high power levels, e.g., greater than 1 watt CW.

Figure 17:
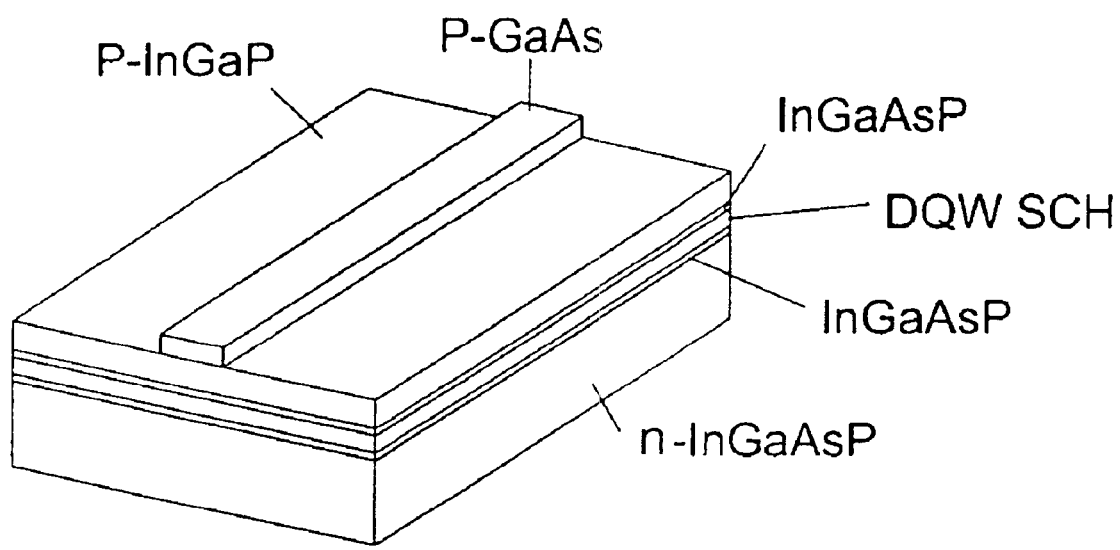
FIG. 17 is an illustrative perspective view of the formation of the semiconductor laser of the present invention at an initial step in the formation of the semiconductor structure.

An example of the fabrication sequence for forming the gratings and ridge-guided structures for the semiconductors lasers of the invention is illustrated in FIGS. 17–21. The exemplary steps proceed as follows:

(a) Etch 3–4 $\mu$m wide ridge waveguide in p-GaAs cap as shown in FIG. 17.

Figure 18:
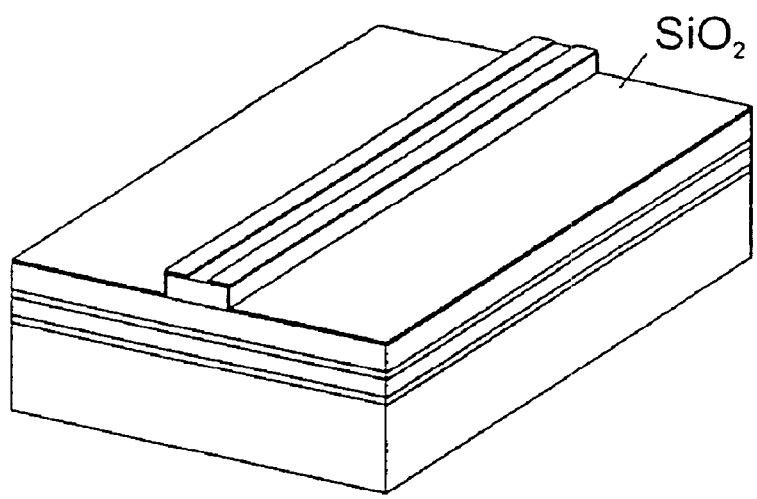
FIG. 18 is an illustrative perspective view of the semiconductor structure of FIG. 17 after a further processing step.

(b) Deposit 500 Å thick SiO₂ over the whole wafer. Etch 2 $\mu$m wide opening in SiO₂ for current injection as shown in FIG. 18.

Figure 19:
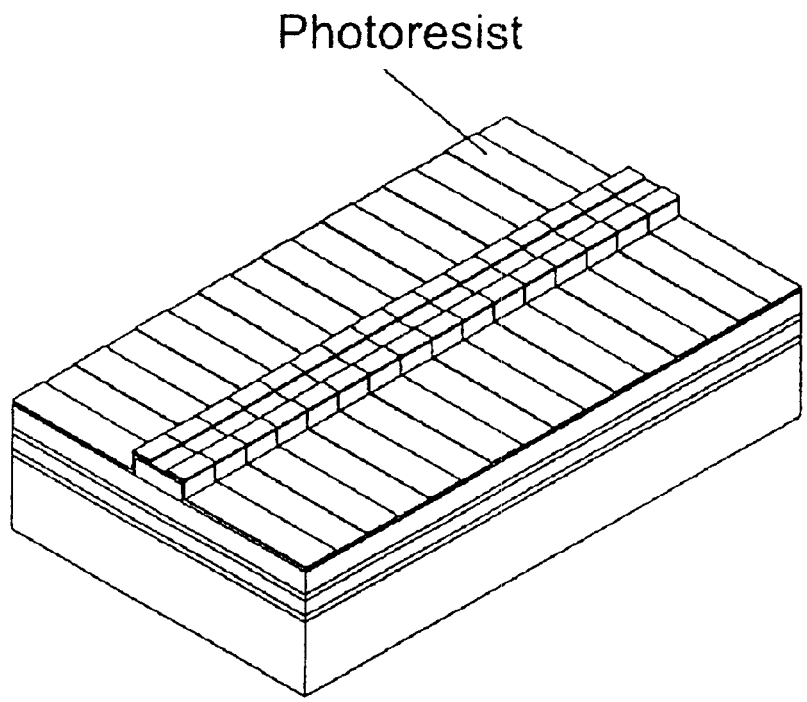
FIG. 19 is an illustrative perspective view of the semiconductor structure of FIG. 18 after a further processing step.

(c) Spin thin (1000 Å thick) photoresist (PR) over the whole wafer. Expose 2$^{nd}$-order grating in a holographic fixture. Develop resist to form a photoresist grating as shown in FIG. 19.

Figure 20:
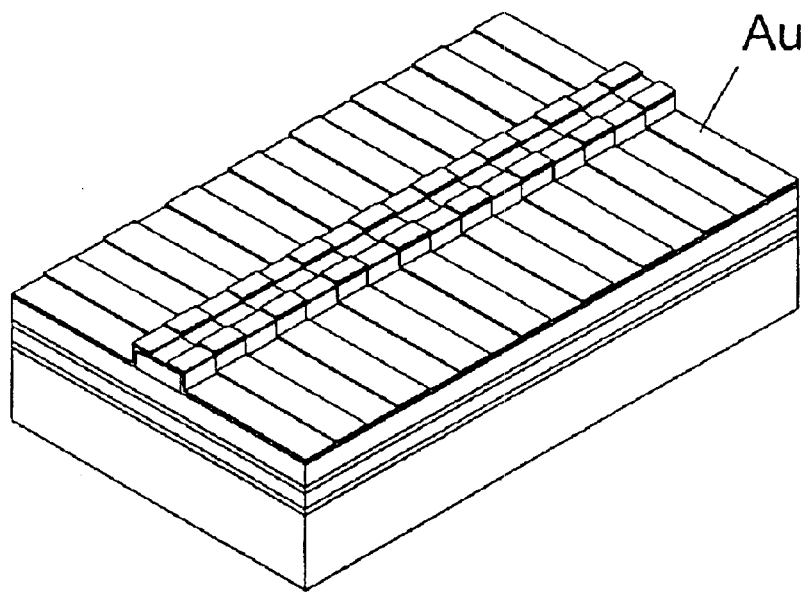
FIG. 20 is an illustrative perspective view of the semiconductor structure of FIG. 19 after a further processing step.

(d) Deposit 20 Å Ti/20 Å Pt/300 Å Au over the whole wafer. Perform metal liftoff in warm acetone and ultrasonic bath to form metal grating as shown in FIG. 20.

Figure 21:
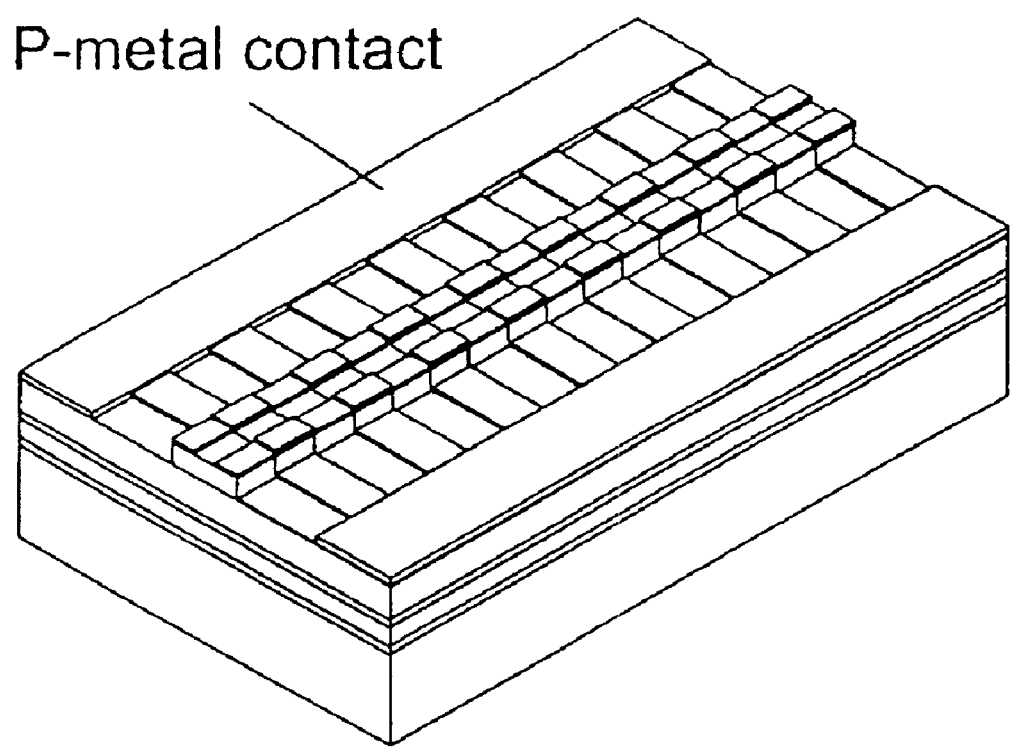
FIG. 21 is an illustrative perspective view of the semiconductor structure of FIG. 20 after a further processing step.

(e) Perform second liftoff procedure to define metal contact stripes of 20 Å Ti/20 Å Pt/1000 Å Au as shown in FIG. 21. For bottom surface-emitters a similar liftoff procedure may be done on the bottom surface of the wafer to open a window in the bottom metal contact if desired.

It is understood that the invention is not limited to the embodiments set forth herein as illustrative, but embraces all such forms thereof as come within the scope of the following claims.

What is claimed is:

1. A surface emitting semiconductor laser comprising:
  (a) a semiconductor structure including a substrate and an epitaxial structure on the substrate, the epitaxial structure including a layer with an active region at which light emission occurs, an upper cladding layer above the active region layer and a lower cladding layer below the active region layer to surround the active region layer, the semiconductor structure having an upper face, a lower face, and edge faces that terminate the semiconductor structure longitudinally, and electrodes at the upper and lower faces by which voltage can be applied across the epitaxial structure and the substrate;

(b) a distributed feedback grating incorporated with the epitaxial structure extending in a longitudinal direction and terminating longitudinally at ends thereof, comprising periodically alternating grating elements to provide optical feedback as a second order grating for a selected effective wavelength of light generation from the active region, the grating having a spacing between adjacent grating elements at a position intermediate the ends of the grating that corresponds to a selected phase shift in the grating, the grating formed and positioned to act upon the light generated in the active region to produce lasing action and emission of light from at least one of the upper and lower faces; and (c) distributed Bragg reflector gratings incorporated with the epitaxial structure and positioned only at the longitudinal ends of the distributed feedback grating to reflect light back longitudinally to the distributed feedback grating wherein current flow is blocked through the distributed Bragg reflector gratings.

2. The semiconductor laser of claim 1 wherein the distributed feedback grating is formed of alternating reflective elements and transmissive elements.

3. The semiconductor laser of claim 1 including means for confining the current from the electrodes to a stripe region.

4. The semiconductor laser of claim 1 wherein both edge faces are formed to be antireflective.

5. The semiconductor laser of claim 1 wherein the distributed Bragg reflector gratings are first order gratings.

6. The semiconductor laser of claim 1 wherein the distributed Bragg reflector gratings are second order gratings.

7. The semiconductor laser of claim 1 including an insulating layer over the distributed Bragg reflector gratings to inhibit current flow through these gratings.

8. The semiconductor laser of claim 1 wherein one of the electrodes is formed on the lower face and has a window opening formed therein to permit light emission therethrough.

9. The semiconductor laser of claim 1 wherein the spacing in the grating corresponds to a grating phase shift of about 180°.

10. The semiconductor laser of claim 1 wherein the spacing is in the middle of the grating.

11. The semiconductor laser of claim 10 wherein the spacing in the grating corresponds to a grating phase shift of about 180°.

12. The semiconductor laser of claim 1 wherein the electrodes are formed on the upper and lower faces of the semiconductor laser and the upper electrode is formed on a cap layer to define an active stripe width over the active region layer at which light emission occurs.

13. The semiconductor laser of claim 12 wherein the active region layer is formed of InGaAsP confinement layers and at least one InGaAs quantum well layer between the InGaAsP confinement layers, and the lower and upper cladding layers are formed of n-type InGaP and p-type InGaP, respectively, and the substrate is formed of GaAs.

14. The semiconductor laser of claim 12 wherein the active region layer has multiple quantum wells defined by layers of InGaAs separated by InGaAsP confinement layers.

15. The semiconductor layer of claim 12 including a cap layer of P-type GaAs over the upper cladding layer and wherein the grating is formed into the cap layer.

* * * * *